United States Patent
Lien et al.

(10) Patent No.: US 11,037,635 B1
(45) Date of Patent: Jun. 15, 2021

(54) POWER MANAGEMENT FOR MULTI-PLANE READ OPERATIONS

(71) Applicant: SanDisk Technologies LLC, Addison, TX (US)

(72) Inventors: Yu-Chung Lien, San Jose, CA (US); Tomer Eliash, Kfar Saba (IL); Huai-Yuan Tseng, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/784,171

(22) Filed: Feb. 6, 2020

(51) Int. Cl.
*G11C 16/04* (2006.01)
*G11C 16/26* (2006.01)
*G11C 16/10* (2006.01)
*G11C 16/08* (2006.01)
*G11C 16/34* (2006.01)

(52) U.S. Cl.
CPC .......... *G11C 16/26* (2013.01); *G11C 16/0483* (2013.01); *G11C 16/08* (2013.01); *G11C 16/10* (2013.01); *G11C 16/3459* (2013.01)

(58) Field of Classification Search
CPC ..... G11C 16/26; G11C 16/0483; G11C 16/08; G11C 16/10; G11C 16/3459
See application file for complete search history.

(56) References Cited

U.S. PATENT DOCUMENTS

| | | | |
|---|---|---|---|
| 6,930,919 B2 * | 8/2005 | Lee .................... | G11C 16/0483 365/185.11 |
| 8,508,998 B2 * | 8/2013 | Haukness ............ | G11C 16/32 365/185.17 |
| 8,787,088 B2 | 7/2014 | Dutta et al. | |
| 8,982,637 B1 | 3/2015 | Dong et al. | |
| 9,110,677 B2 | 8/2015 | Ravimohan et al. | |
| 9,449,700 B2 | 9/2016 | Shah et al. | |
| 9,583,198 B1 | 2/2017 | Pang et al. | |
| 9,792,995 B1 | 10/2017 | Shah et al. | |
| 10,026,486 B1 | 7/2018 | Dutta et al. | |

(Continued)

OTHER PUBLICATIONS

International Search Report & the Written Opinion of the International Searching Authority dated Aug. 2, 2020, International Application No. PCT/US2020/035019.

(Continued)

*Primary Examiner* — Pho M Luu

(74) *Attorney, Agent, or Firm* — Vierra Magen Marcus LLP

(57) ABSTRACT

Apparatuses and techniques are described for managing power consumption in a memory device. When a multi-plane read command is received, a control circuit determines whether the blocks identified by the read command are fully or partially programmed. If they are fully programmed, the read command is executed while applying a common read pass voltage to the unprogrammed word lines of the respective blocks. If the blocks are not all fully programmed, the control circuit determines a last-programmed word line. If the last-programmed word lines are not equal in each block, the read command is executed while applying a base read pass voltage to the unprogrammed word lines of one or more higher-programmed blocks and a lower read pass voltage to the unprogrammed word lines of one or more lower-programmed blocks.

17 Claims, 22 Drawing Sheets

(56) References Cited

U.S. PATENT DOCUMENTS

| | | | |
|---|---|---|---|
| 10,043,558 | B2 | 8/2018 | Shah et al. |
| 10,235,294 | B1 | 3/2019 | Lu et al. |
| 10,402,314 | B2 * | 9/2019 | Lo ................... G11C 16/349 |
| 2008/0266973 | A1 | 10/2008 | Sekar et al. |
| 2009/0238805 | A1 | 9/2009 | You |
| 2014/0179068 | A1 | 6/2014 | Samachisa et al. |
| 2017/0365335 | A1 | 12/2017 | Wang et al. |
| 2019/0214100 | A1 | 7/2019 | Puthenthermadam et al. |
| 2019/0227719 | A1 | 7/2019 | Park et al. |
| 2020/0142744 | A1 * | 5/2020 | Tolstsikau ............ G06F 9/5016 |

OTHER PUBLICATIONS

U.S. Appl. No. 16/688,587, filed Nov. 19, 2019.

* cited by examiner

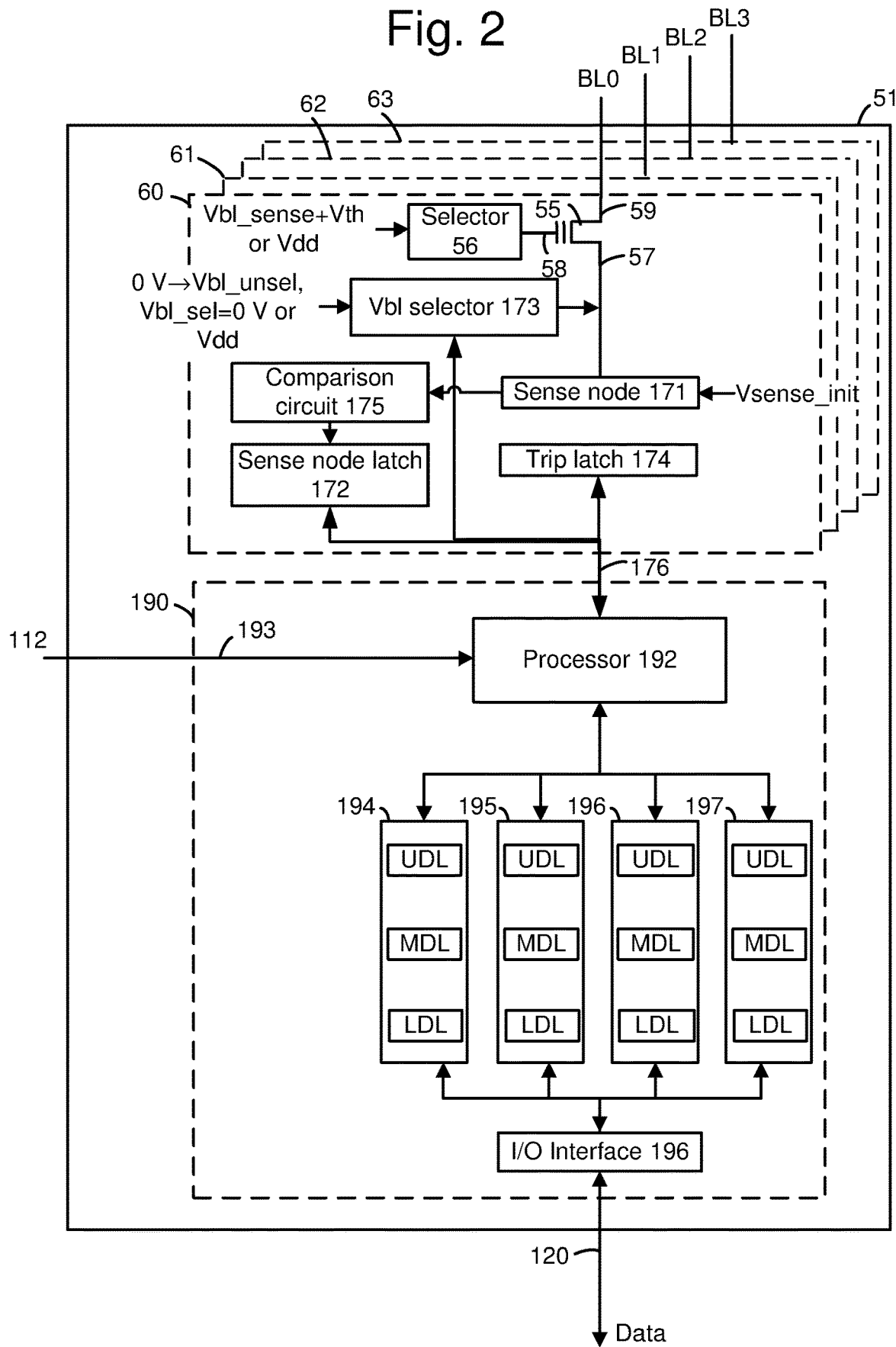

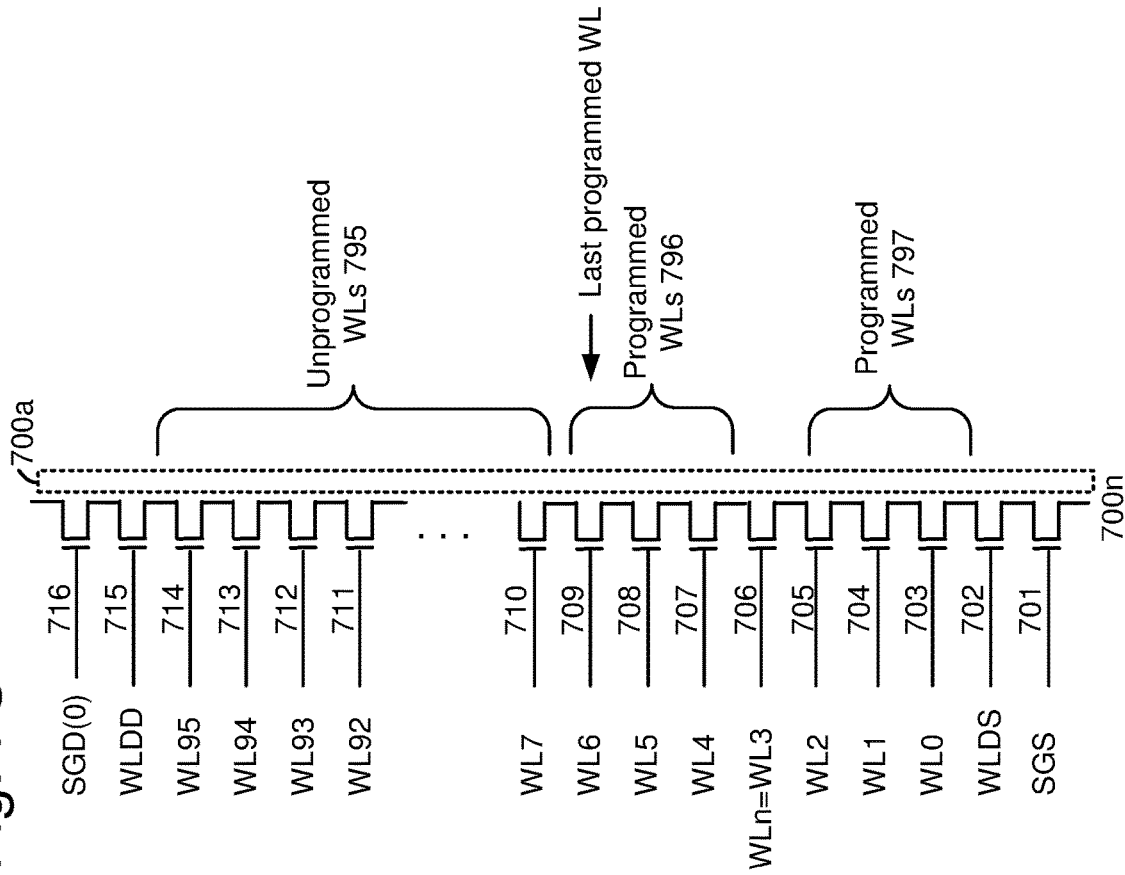
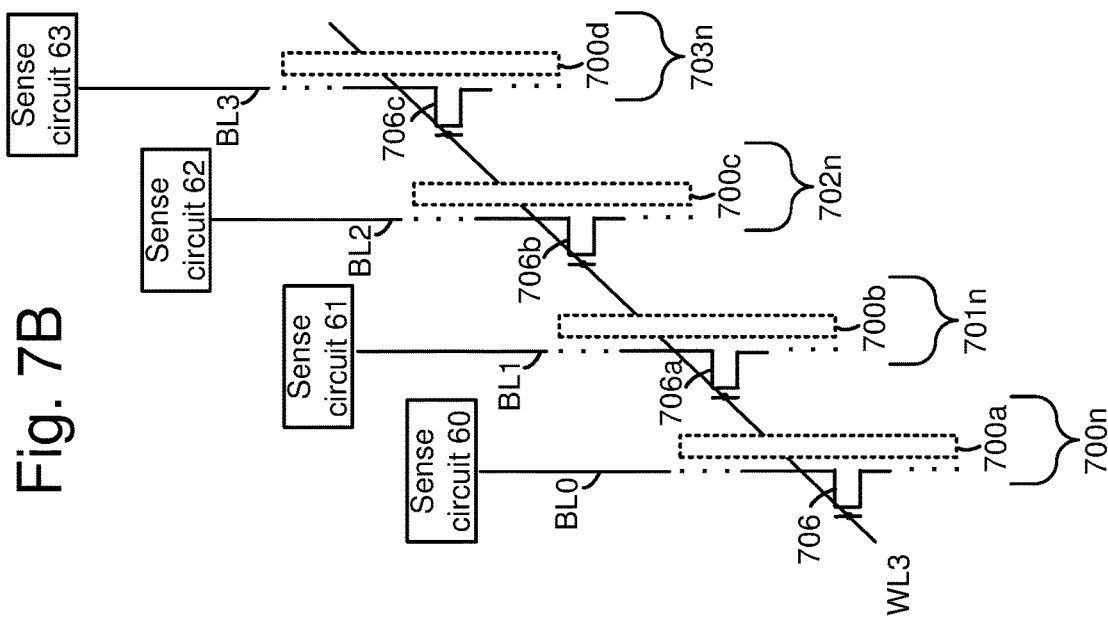

Fig. 8E

| Block | Fully prog. | Last-prog. WL |
|---|---|---|
| B0-0 | no | WLb(P0) |
| B0-1 | | |
| ... | | |
| B0-n-1 | | |
| | | |
| B1-0 | no | WLb(P1) |
| B1-1 | | |
| ... | | |
| B1-n-1 | | |
| | | |
| B2-0 | no | WLb(P2) |
| B2-1 | | |
| ... | | |
| B2-n-1 | | |
| | | |
| B3-0 | no | WLb(P3) |
| B3-1 | | |
| ... | | |
| B3-n-1 | | |

119

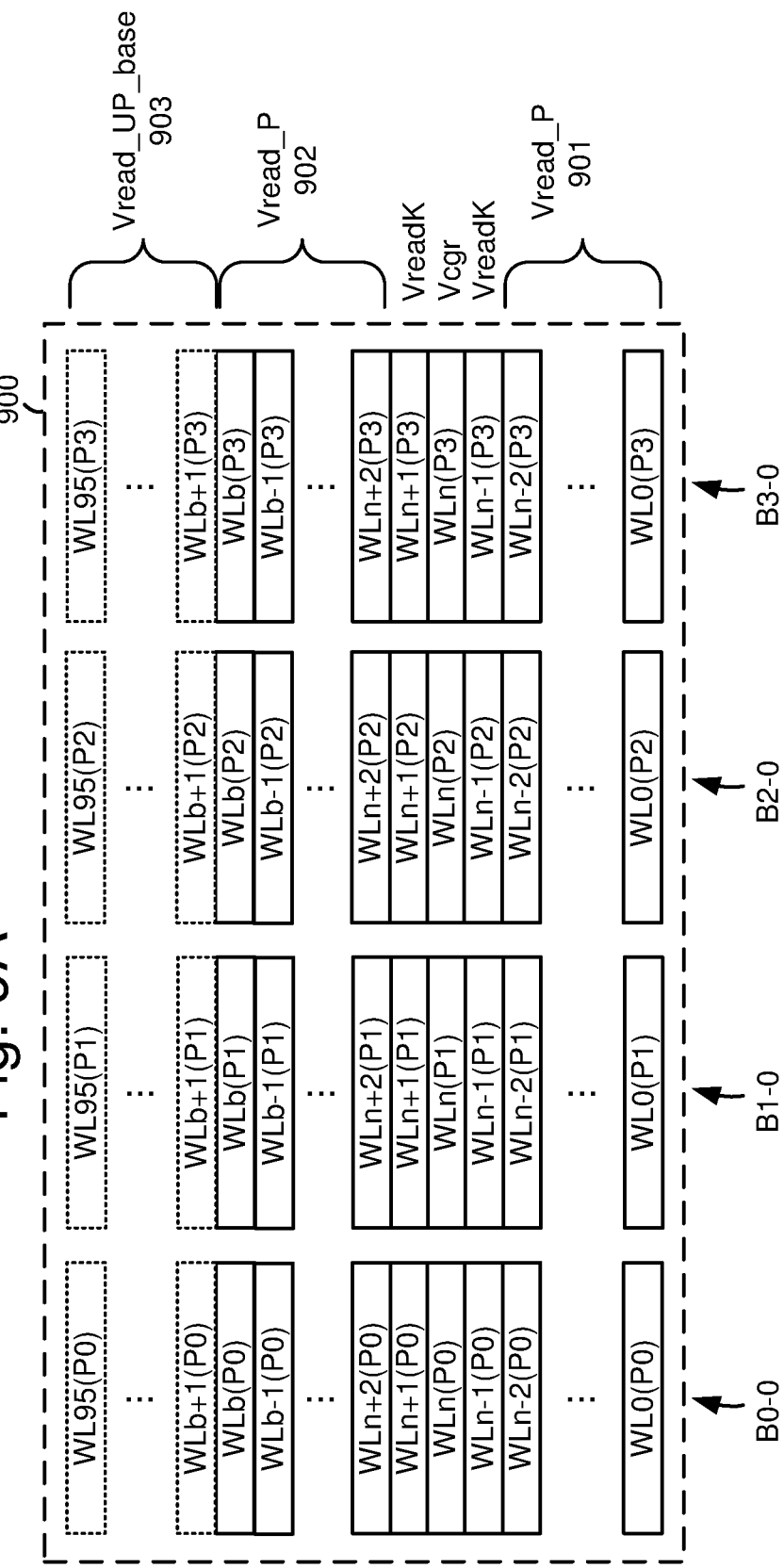

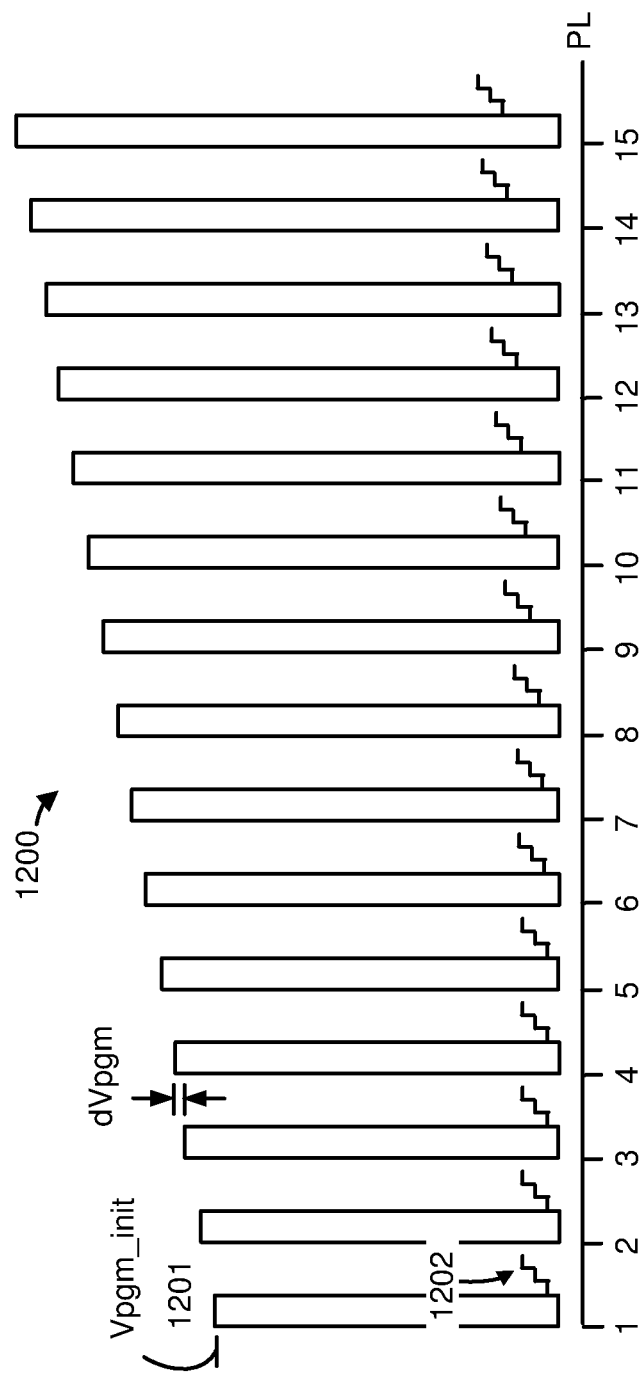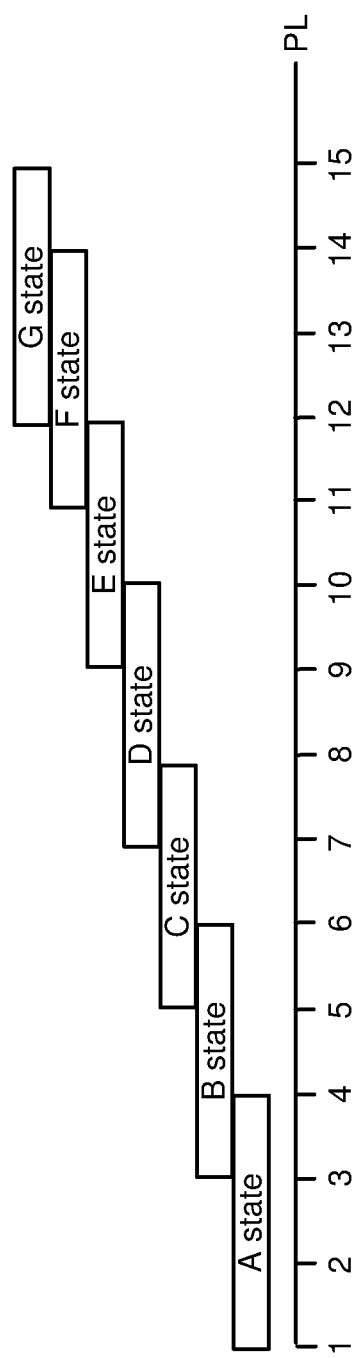

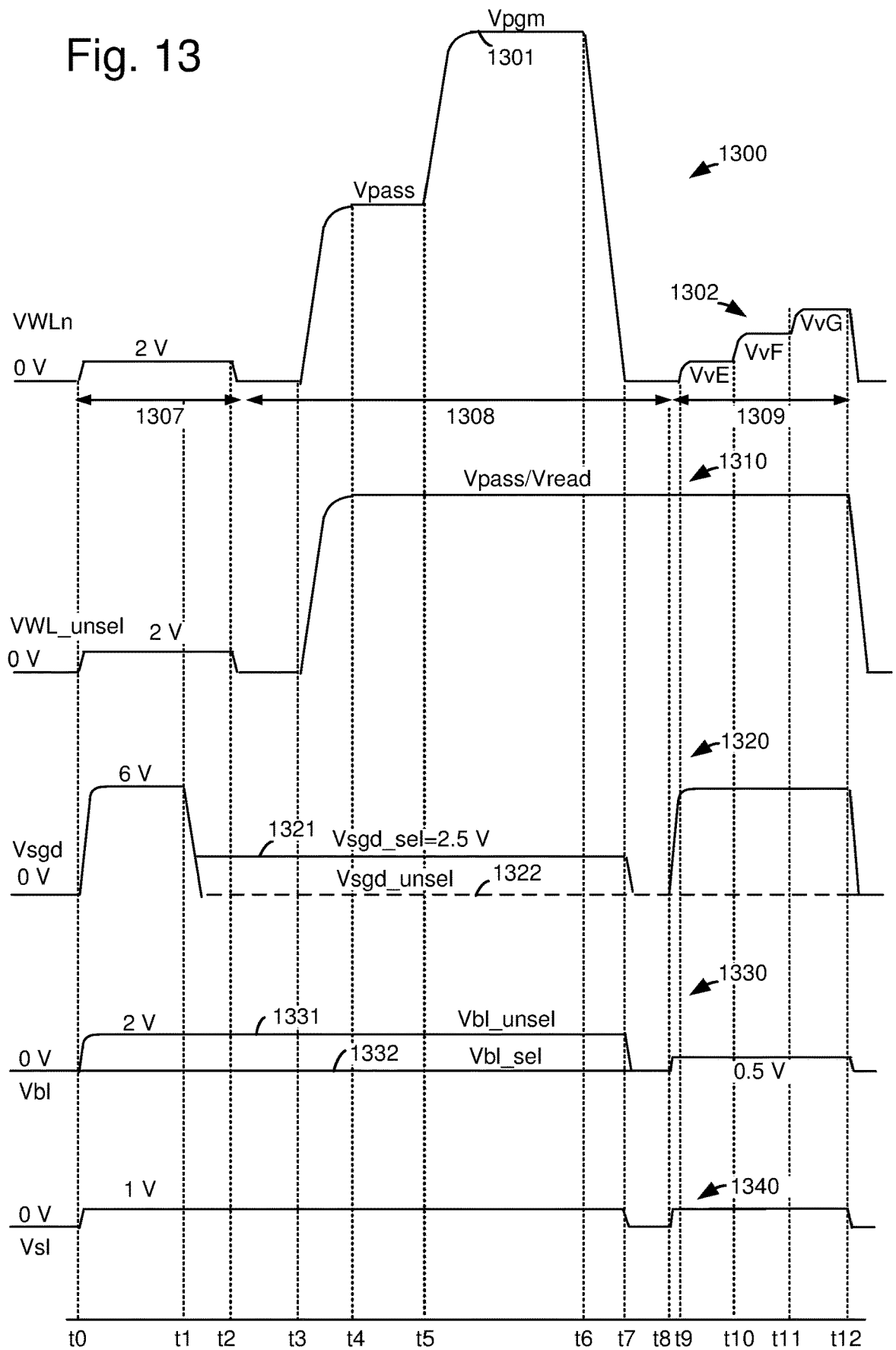

US 11,037,635 B1

POWER MANAGEMENT FOR MULTI-PLANE READ OPERATIONS

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 2 is a block diagram depicting one embodiment of the sense block 51 of FIG. 1A.

FIG. 7B depicts an example view of memory cells connected to WL3 in the sub-block SB0 of FIG. 7A, with respective NAND strings, bit lines and sense circuits.

FIG. 7C depicts an example view of the NAND string 700n of FIGS. 7A and 7B, showing overdrive voltages of the channel 700a during a read operation, where WLn=WL3 is the selected word line.

FIG. 8E depicts an example table 119 maintained by the RAM 122b of FIG. 1A for use in connection with FIG. 8A-8D.

FIG. 9A depicts a first example configuration of the set of respective blocks B0-0 to B0-3, where the blocks have a same boundary word line and a common read pass voltage, Vread_UP_base, is applied to unprogrammed word lines.

FIG. 12A depicts an example voltage signal used in a program operation, consistent with FIGS. 8D and 11B.

FIG. 12B depicts an example of verify voltages used in the different program loops of FIG. 12A.

FIG. 13 depicts example voltage signals for performing a program operation, consistent with FIG. 12A.

DETAILED DESCRIPTION

Apparatuses and techniques are described for managing power consumption while performing multi-plane read operations.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells, which is connected to a source line. Further, the memory cells can be arranged with a common control gate line (e.g., word line) which acts a control gate. A set of word lines extends from the source-side of a block to the drain-side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells. In a 2D memory structure, the memory cells may be arranged in horizontal NAND strings on a substrate.

Figures 4, 5:
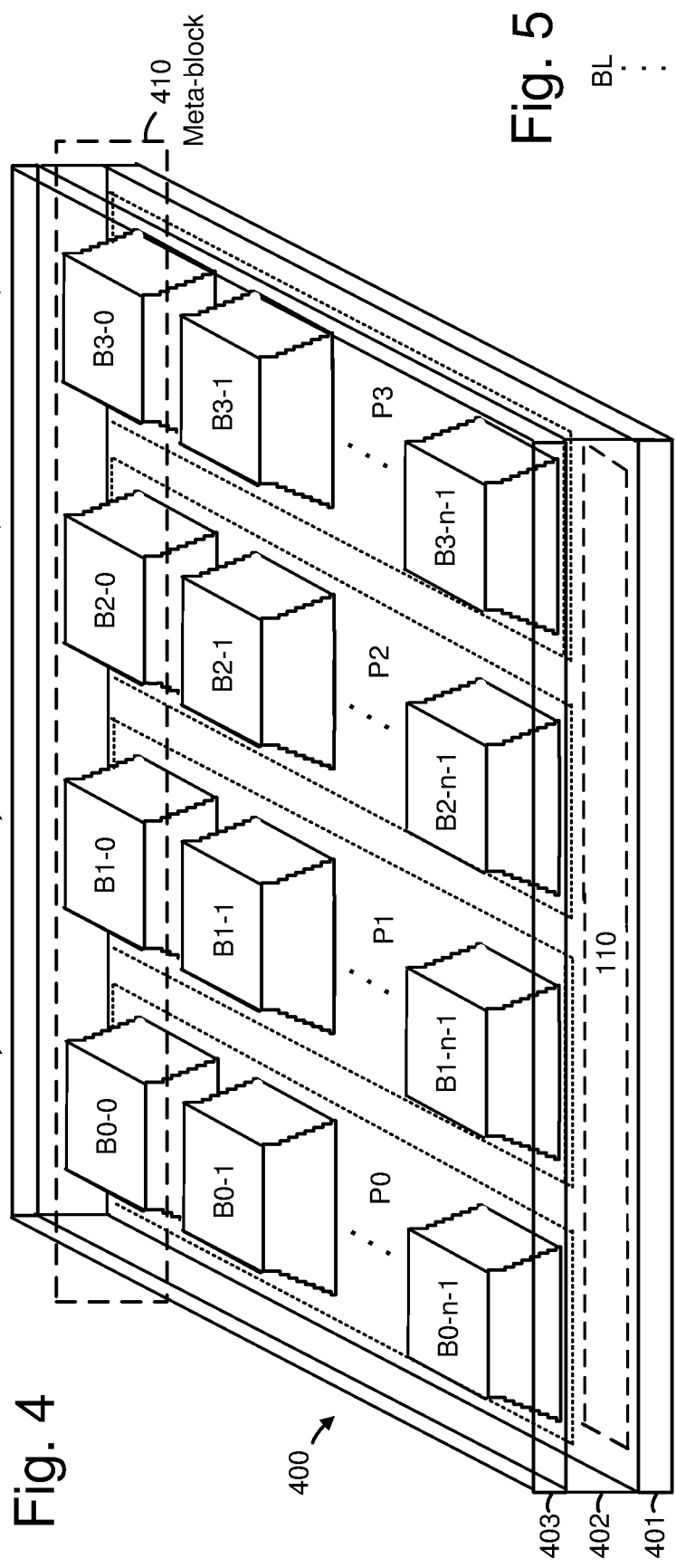
FIG. 4 is a perspective view of an example memory die 400 consistent with FIG. 1A, where blocks of memory cells are provided in respective planes P0-P3, and a meta-block 410 comprises blocks B0-0 to B3-0.
FIG. 5 depicts an example transistor 520 in the memory structure 126 of FIG. 1A.

In some cases, the blocks of memory cells are arranged in different planes on a substrate on one or more die, such as depicted in FIG. 4. Furthermore, the blocks in different planes can be grouped into a meta-block and read concurrently in a multi-plane read operation. The meta-block forms a unit of data which can be read by a host device. A multi-plane read operation can involve a respective block in all planes, in which case it is an all-plane read operation, or a respective block in fewer than all planes. Further, a meta-block can include blocks which have a same relative position in each plane, such as the meta-block 410 in FIG. 4, which includes the first block in each plane, e.g., B0-0 to B3-0. Or, a meta-block can include blocks which have different relative positions in their plane. For example, in FIG. 4, a meta-block could include B0-0, the first block in P0, and B1-1 to B3-1, the second blocks in P1-P3, respectively.

However, a multi-plane read operation can consume a significant amount of current. In particular, it has been observed that current consumption increases when a read operation occurs in blocks which are partially programmed by different amounts. Both average and peak current consumption should be maintained within specified limits. The average current consumption should be limited to optimize the lifetime of a battery of the memory device and the peak current consumption should be limited to avoid a malfunction of the memory device due to voltage droop.

Techniques provided herein address the above and other issues. In one aspect, when a multi-plane read command is received at a control circuit of a memory device, the control circuit determines whether the blocks identified by the read command are fully or partially programmed. If they are fully programmed, the read command is executed concurrently for a selected word line in each block while applying a common read pass voltage to the erased (unprogrammed) word lines of the respective blocks. If the respective blocks are not all fully programmed, the control circuit determines a boundary word line in each respective block, that is, a last-programmed word line. If the boundary word lines are equal in each respective block, the read command is executed concurrently for a selected word line in each block while applying a common read pass voltage to the unprogrammed word lines of the respective blocks. If the boundary word lines are not equal in each respective block, the read command is executed concurrently for a selected word line in each block while applying a base read pass voltage to the unprogrammed word lines of one or more higher-programmed blocks and a lower read pass voltage to the unprogrammed word lines of one or more lower-programmed blocks.

The lower read pass voltage can be lower when a number of the lesser-programmed blocks is greater. By reducing the read pass voltage, the voltage overdrive of the memory cells is reduced so that the current consumption is reduced.

In another aspect, the all-plane read command is replaced by one or more substitute read commands if the respective blocks are not all fully programmed and the boundary word lines are not equal in each respective block. For example, a higher programmed block can be read by itself in a single-plane read operation while the other respective blocks are inactive and therefore do not consume current. In another approach, the respective blocks are read in independent read operations which can be started at different times to reduce current. The independent read operations can be partially overlapping in time or non-overlapping.

In another aspect, an initial determination is made when the memory device is powered on, and before a read command is received, of whether the respective blocks are fully programmed and, if they are not fully programmed, their boundary word lines are determined. A multi-plane pre-fetch operation can use this information to avoid reading blocks in which the boundary word lines are not equal to reduce current consumption.

These and other features are discussed further below.

Figure 1A:
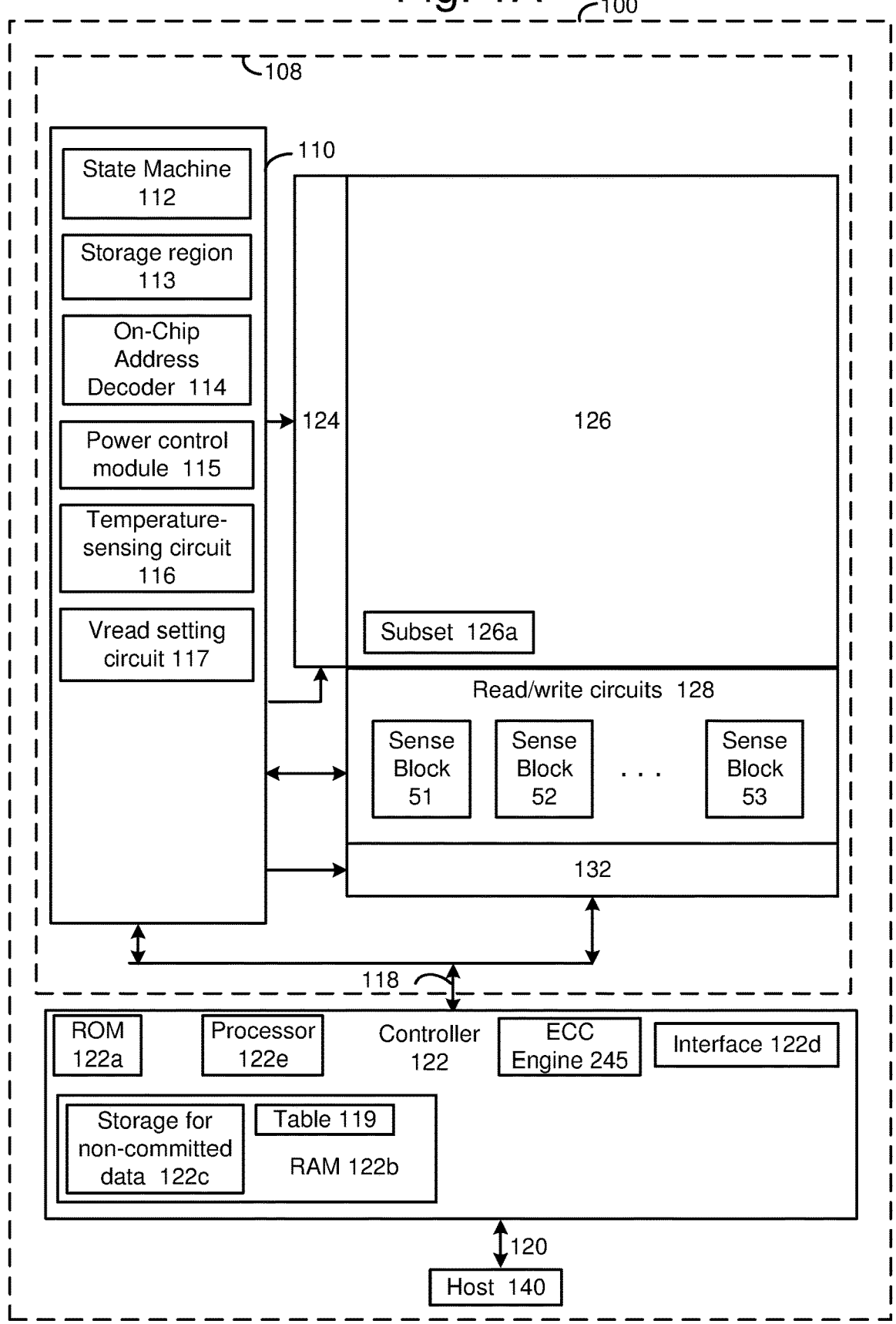
FIG. 1A is a block diagram of an example memory device.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, a power control module 115 (power control circuit), a temperature-sensing circuit 116 and a Vread setting circuit 117. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach. The temperature-sensing circuit 116 can detect a temperature of the memory device on during the lifetime of the memory device, e.g., every minute. The Vread magnitudes in the Vread setting circuit 117 can be adjusted based on the temperature. For example, as the temperature increases, Vread can be decreased, since the current in the NAND string channels is higher. Generally, the temperature-sensing circuit is configured to provide an indication of a temperature, for use in setting a lower read pass voltage to be relatively lower when the temperature is relatively higher. The Vread setting circuit 117 can set a read pass voltage (Vread) during read operations. See FIG. 9A-10B for examples.

Figure 1B:
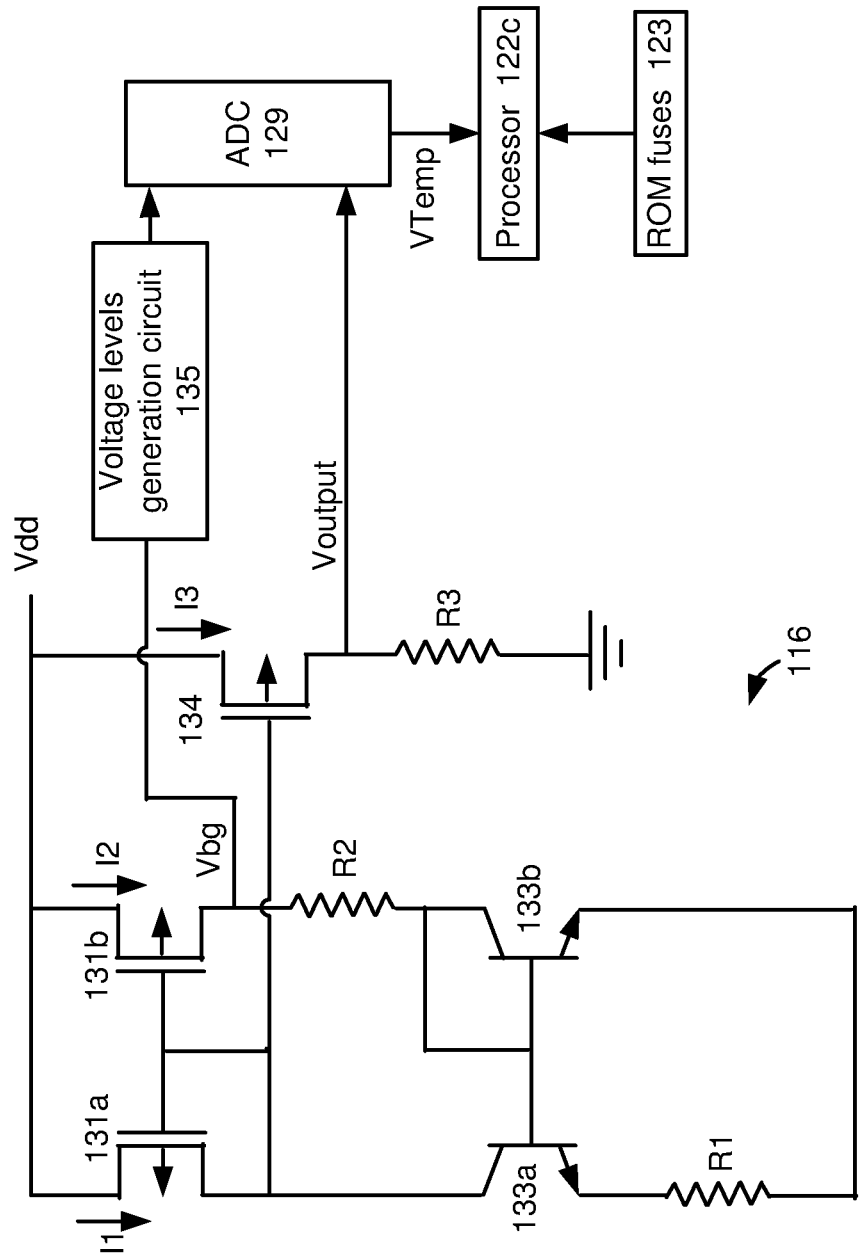
FIG. 1B depicts an example of the temperature-sensing circuit 116 of FIG. 1A.

See FIG. 1B for an example implementation of the temperature-sensing circuit. The circuits 116 and 117 may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 115, temperature-sensing circuit 116, Vread setting circuit 117, sense blocks 51, 52, . . . , 53, read/write circuits 128, controller 122, and so forth.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which includes a storage location 122c for non-committed data. During programming, a copy of the data to be programmed is stored in the storage location 122c until the programming is successfully completed. In response to the successful completion, the data is erased from the storage location and is committed or released to the block of memory cells. The storage location 122c may store one or more word lines of data.

The RAM 122b may also include a table 119 which stores information about used blocks, such as the last programmed word line. See FIG. 8E. In one approach, there are two zones which the system uses to store information about used blocks. Specifically, a logical-to-physical (L2P) table (stored in the memory structure 126) and a temporary table for open blocks (stored in the RAM 122b). Each time the system opens a new block for use, it writes the information into a table in the array to make sure that it will know where to look for it—if it loses the data in the RAM. If the system gets an indication that a power cycle is planned, it will dump all the information from the RAM 122b into the array to keep it there for later retrieval. If the power cuts off suddenly, the system loses the information and has to recover it, e.g., by performing some searches on the open blocks, by using the list it previously saved.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The controller, e.g., RAM 122b and/or the control circuitry 110, can store parameters which indicate an expected number of fail bits in a block. These parameters can include, e.g., the number of bits per cell stored in the memory cells, a portion of the word lines which are programmed in a block or sub-block, a portion of the sub-blocks which are programmed in a block, a strength of an ECC process used to store and read data in the block, a duration of pre-read voltage pulse, if used, and a read accuracy, such as a bit line or word line voltage settling time and a number of sensing passes.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), phase change resistive random access memory (PCRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B depicts an example of the temperature-sensing circuit 116 of FIG. 1A. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor 122e. This is data indicating a temperature of the memory device. ROM fuses 123 store data which correlates the matching voltage level to a temperature, in one approach. The processor then uses the temperature to set temperature-based parameters in the memory device such as by using the comparison circuit.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line and NAND string, and a common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. See also Vb1 in FIG. 13. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg−Vth, where Vcg is the voltage on the control gate 58 and Vth, e.g., 1 V, is the threshold voltage of the transistor 55. This assumes the source line is at 0 V. This mode can be used during sensing operations such as read and verify operations. The bit line voltage is thus set by the transistor 55 based on the voltage output by the selector 56. For example, the selector 56 may pass Vb1_sense+Vth, e.g., 1.5 V, to the transistor 55 to provide Vb1_sense, e.g., 0.5 V, on the bit line. A Vb1 selector 173 may pass a relatively high voltage such as Vdd to the drain 57, which is higher than the control gate voltage on the transistor 55, to provide the source-follower mode during sensing operations.

The Vb1 selector 173 can pass one of a number of voltage signals. For example, the Vb1 selector can pass a program-inhibit voltage signal which increases from an initial voltage, e.g., 0 V, to a program inhibit voltage, e.g., Vb1_unsel (also referred to as Vb1_inh) for respective bit lines of unselected NAND string during a program loop. The Vb1 selector 173 can pass a program-enable voltage signal such as 0 V for respective bit lines of selected NAND strings during a program loop. The Vb1 selector may receive voltage signals from the first, second and third voltage sources 340a-440c, respectively, in FIG. 3, and select one of these signals based on commands from the processor 192, for example.

In one approach, the selector 56 of each sense circuit can be controlled separately from the selectors of other sense circuits. The Vb1 selector 173 of each sense circuit can also be controlled separately from the Vb1 selectors of other sense circuits During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. The data in the sense node latch can be a bit which is read out by the processor 192 and used to update a trip latch 174. Subsequently, for a next program loop, a bit in the trip latch can be used by the processor, along with the assigned data state in the latches 194-197 to determine whether a memory cell and NAND string are selected or unselected for programming in the program loop, and to thereby pass the appropriate enable or inhibit bit line voltage, respectively, to the bit line. The latches 194-197 may be considered to be data latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3:
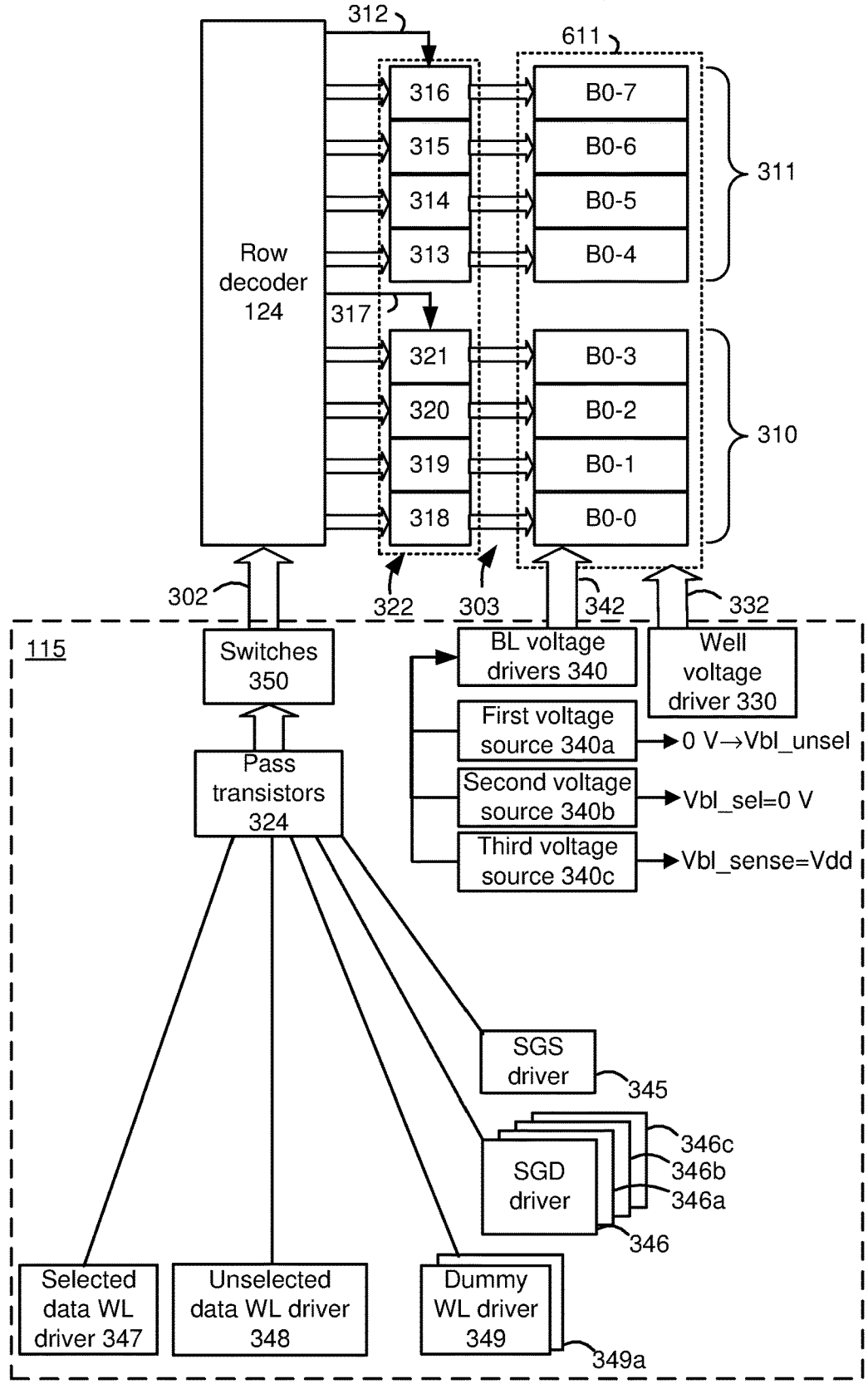
FIG. 3 depicts an example implementation of the power control circuit 115 of FIG. 1A for providing voltages to blocks of memory cells in a plane.

FIG. 3 depicts an example implementation of the power control circuit 115 of FIG. 1A for providing voltages to blocks of memory cells in a plane. The circuitry shown can be repeated for each plane of a die, in one approach. In this example, the memory structure 126 includes a set 310 of four related blocks, B0-0 to B0-3, and another set 311 of four related blocks, B0-4 to B0-7. The blocks can be in one or more planes. The row decoder 124 of FIG. 1A provides voltages to word lines and select gates of each block via pass transistors 322. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 312 is connected to sets of pass transistors 313, 314, 315 and 316, which in turn are connected to control gate lines of B0-4, B0-5, B0-6 and B0-7, respectively. A control gate line 317 is connected to sets of pass transistors 318, 319, 320 and 321, which in turn are connected to control gate lines of B0-0, B0-1, B0-2 and B0-3, respectively.

Typically, program or read operations are performed on one selected sub-block at a time in a block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

The voltage drivers can include a selected data word line (WL) driver 347, which provides a voltage on a data word line selected during a program or read operation. The driver 347 can provide a pre-charge voltage and a program voltage on WLn during a program loop of a program operation. A driver 348 can be used for unselected data word lines, and dummy word line drivers 349 and 349a can be used to provide voltages on dummy word lines WLDD and WLDS, respectively, in FIG. 6A. For example, the driver 348 can be used to apply a pre-charge voltage and a pass voltage on the unselected word lines during a program loop of a program operation. See also VWL_unsel in FIG. 13.

The voltage drivers can also include separate SGD drivers for each sub-block. For example, SGD drivers 346, 346a, 346b and 346c can be provided for SB0, SB1, SB2 and SB3, respectively, such as in FIG. 7A. In one option, an SGS driver 345 is common to the different sub-blocks in a block.

The various components, including the row decoder, may receive commands from a controller such as the state machine 112 or the controller 122 to perform the functions described herein.

The well voltage driver 330 provides a voltage Vs1 to the well region 611b (FIG. 6A) in the substrate, via control lines 332. The well voltage driver 330 is one example of a source line driver, where the well region 611b is a source line, e.g., a conductive path connected to the source ends of the NAND strings. In one approach, the well region 611a is common to the blocks. A set of bit lines 342 is also shared by the blocks.

Bit line voltage drivers 340 include voltage sources which provide voltages to the bit lines. For example, the bit line voltage drivers can include a first voltage source 340a which is configured to output a program-inhibit voltage signal. This signal increases from an initial level such as 0 V to a final, peak level such as Vb1_unsel, to pre-charge a channel of a respective NAND string and prevent programming of memory cells in the NAND string.

The bit line voltage drivers can also include a second voltage source 340b which is configured to output a program-enable voltage signal. This signal can have a fixed voltage such as 0 V which allows programming to occur for a selected memory cell in a respective NAND string. The bit line voltage drivers can also include a third voltage source 340c which is configured to output a fixed voltage, Vb1_sense, which allows sensing to occur for a selected memory cell in the respective NAND string. The sensing can occur during a read or a verify test. The voltage sources 340a, 340b and 340c may be connected to the sense circuits and used to provide voltages to the Vb1 selector 173 of FIG. 2, for example.

In a stacked memory device such as depicted in FIG. 4 to 7C, sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

FIG. 4 is a perspective view of an example memory die 400 consistent with FIG. 1A, where blocks of memory cells are provided in respective planes P0-P3, and a meta-block 410 comprises blocks B0-0 to B3-0. The memory die includes a substrate 401, an intermediate region 402 in which blocks of memory cells are formed, and an upper region 403 in which one or more upper metal layers are patterned such as to form bit lines. Planes P0-P3 represent respective isolation regions which are formed in the substrate 401. Further, blocks sequences 405, 415, 425 and 435 of a number n blocks, labelled B0-0 to B0-$n$–1, B1-0 to B1-$n$–1, B2-0 to B2-$n$–1 and B3-0 to B3-$n$–1, are formed in P0-P3, respectively. Each plane may have associated row and column control circuitry, such as the row decoder 124, read/write circuits 128 and column decoder 132 of FIG. 1A.

The control circuitry 110, which may be located in a peripheral area of the die, may be shared among the planes, in one approach. Each plane may have a separate set of bit lines.

By providing blocks of memory cells in multiple planes, parallel operations can be performed in the planes. Moreover, the blocks of a meta-block can be read concurrently as a data unit in a multi-plane read operation. Typically, the same selected word line and page type are read in each block, and the read operations occur concurrently. The blocks in a meta-block may contain related data in some cases. The block of a meta-block can be arranged on a common die or extend across multiple die.

The substrate 201 can also carry circuitry under the blocks, and one or more lower metal layers which are patterned in conductive paths to carry signals of the circuitry.

In this example, the memory cells are formed in vertical NAND strings in the blocks. Each block comprises a stacked area of memory cells, where alternating levels of the stack represent word lines. In one possible approach, each block has opposing tiered sides from which vertical contacts extend upward to an upper metal layer to form connections to conductive paths. While four planes are depicted as an example, other examples can use fewer, e.g., two, planes or more, e.g., eight, planes. One plane per die is also possible.

While the above example is directed to a 3D memory device with vertically extending NAND strings, the techniques provided herein are also applicable to a 2D memory device in which the NAND strings extend horizontally on a substrate.

Figure 6A:
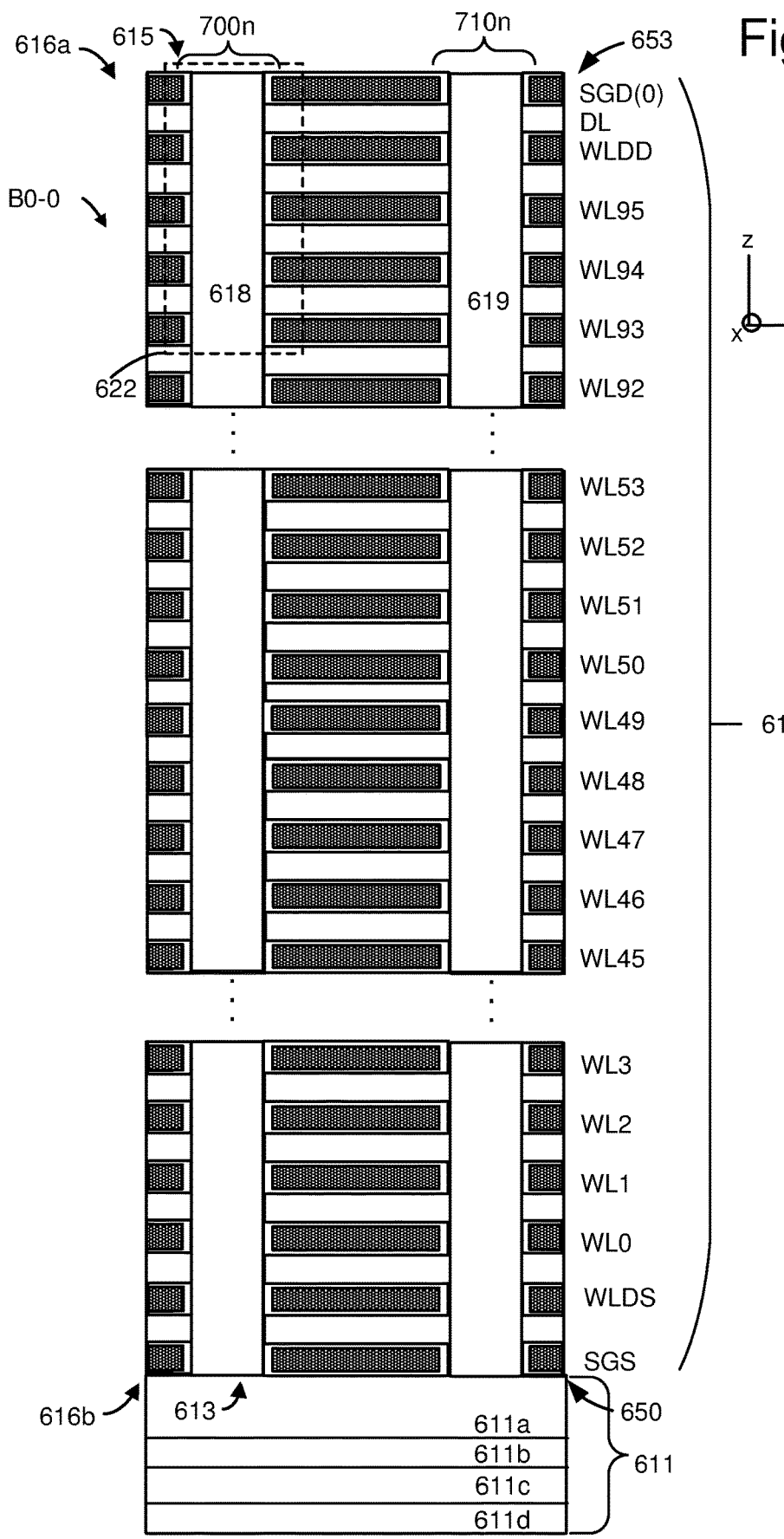
FIG. 6A depicts an example cross-sectional view of a portion of the block B0-0 of FIG. 4, including NAND strings 700n and 710n.

FIG. 5 depicts an example transistor 520 in the memory structure 126 of FIG. 1A. The transistor comprises a control gate CG, a drain D, a source S and a channel CH and may represent a memory cell or a select gate transistor, for example. The drain end of the transistor is connected to a bit line BL optionally via one or more other transistors in a NAND string, and the source end of the transistor is connected to a source line SL optionally via one or more other transistors in a NAND string, FIG. 6A depicts an example cross-sectional view of a portion of the block B0-0 of FIG. 4, including NAND strings 700n and 710n. In this example, the NAND strings 700n and 710n are in different sub-blocks. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0). WLDS and WLDD are dummy word lines or conductive layers connected to dummy memory cells, which are ineligible to store user data. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data. As an example only, the stack includes ninety-six data word lines. DL is an example dielectric layer.

A top 653 and bottom 650 of the stack are depicted. WL95 is the topmost data word line or conductive layer and WL0 is the bottommost data word line or conductive layer.

The NAND strings each comprise a memory hole 618 or 619, respectively, which is filled with materials which form memory cells adjacent to the word lines. For example, see region 622 of the stack which is shown in greater detail in FIG. 6B.

The stack is formed on a substrate 611. In one approach, a well region 611a (see also FIG. 3) is an n-type source diffusion layer or well in the substrate. The well region is in contact with a source end of each string of memory cells in a block. The n-type well region 611a in turn is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach, and form a source line SL which provides a voltage to a source end of each NAND string in a block.

The NAND string 700n has a source end 613 at a bottom 616b of the stack 610 and a drain end 615 at a top 616a of the stack. Metal-filled slits may be provided periodically across the stack as local interconnects which extend through the stack, such as to connect the source line to a line above the stack. The slits may be used during the formation of the word lines and subsequently filled with metal. Vias may be connected at one end to the drain ends of the NAND strings and at another end to a bit line.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

Figure 6B:
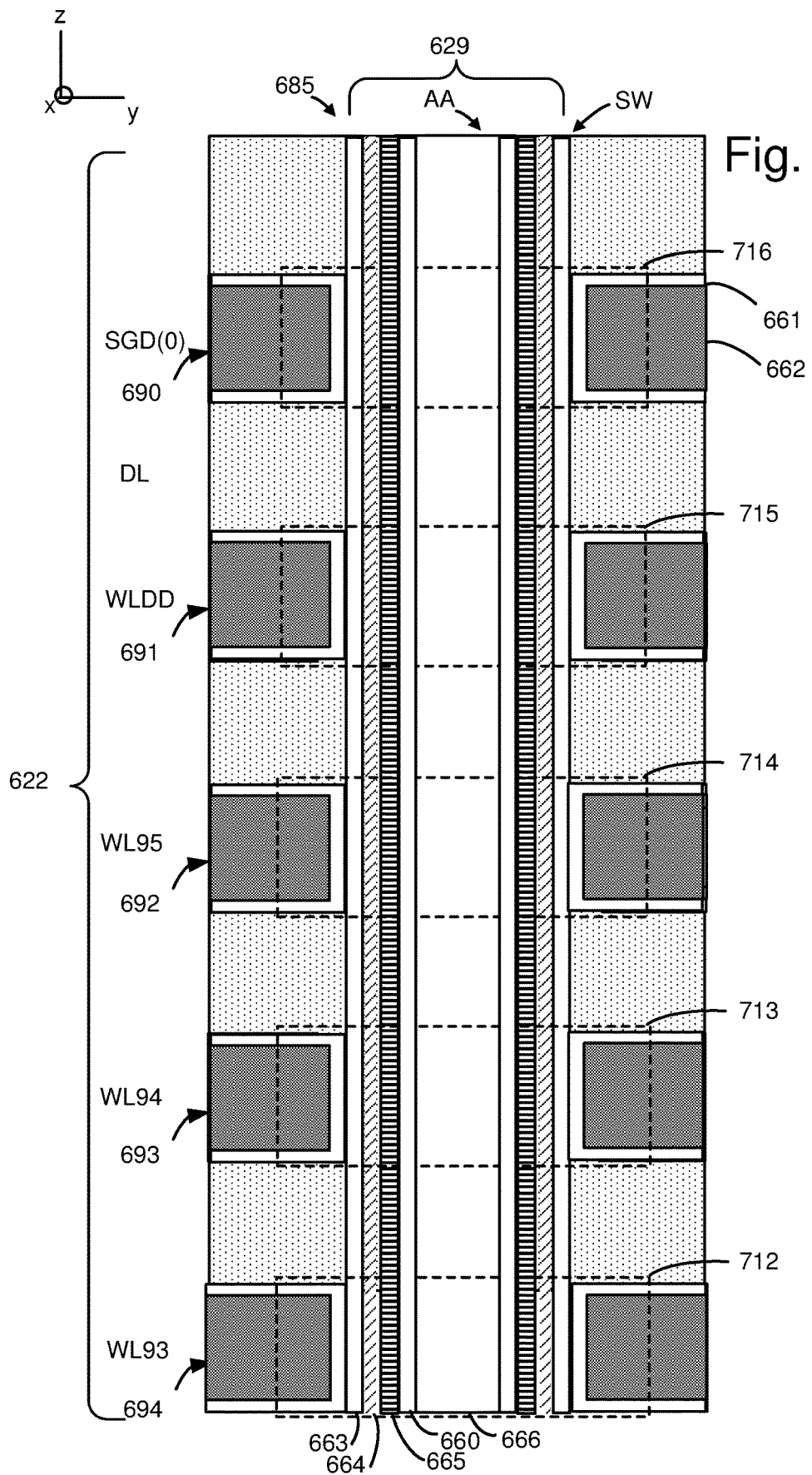
FIG. 6B depicts a close-up view of the region 622 of the stack of FIG. 6A.

FIG. 6B depicts a close-up view of the region 622 of the stack of FIG. 6A. Memory cells are formed at the different levels of the stack at the intersection of a word line layer and a memory hole. An SGD transistor 716 connected to SGD (0), a dummy memory cell 715 connected to WLDD and data memory cells 712-714 connected to WL93-WL95, respectively, are depicted.

A number of layers can be deposited along the sidewall (SW) of the memory hole 629 and/or within each word line layer, e.g., using atomic layer deposition. For example, each pillar 685 or column which is formed by the materials within a memory hole can include a blocking oxide layer 663, a charge-trapping layer 664 or film such as silicon nitride (Si3N4) or other nitride, a tunneling layer 665 (e.g., a gate oxide), a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700a, 710a, 720a and 730a extend continuously in the NAND strings 700n, 710n, 720n and 730n, respectively, from the source end to the drain end of each NAND string.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. See FIG. 6C-6F. During an erase operation, the electrons return to the channel.

While the above example is directed to a 3D memory device with vertically extending NAND strings, the techniques provided herein are also applicable to a 2D memory device in which the NAND strings extend horizontally on a substrate. Both 2D and 3D NAND strings may have a polysilicon channel with grain boundary traps. Moreover, the techniques may be applied to memory devices with other channel materials as well.

Figure 7A:
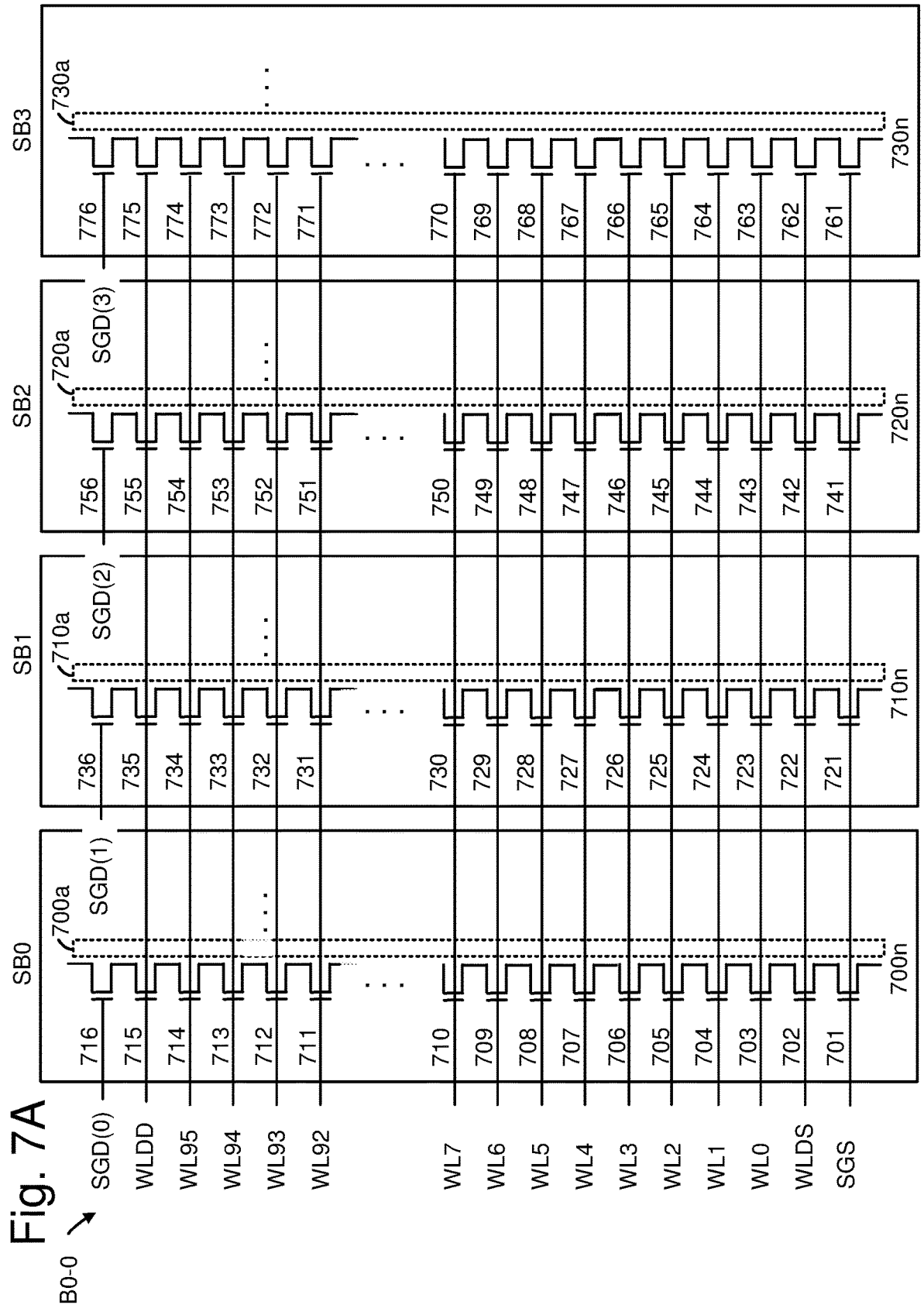
FIG. 7A depicts an example view of NAND strings in the block B0-0 which is consistent with FIGS. 4 and 6A.

FIG. 7A depicts an example view of NAND strings in the block B0-0 which is consistent with FIGS. 4 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively.

Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB2, then programming WL1 in SB0, SB1, SB2 and then SB2, and so forth. The word line programming order may start at WL0, the source-end word line and end at WL95, the drain-end word line, for example.

The NAND strings 700n, 710n, 720n and 730n have channels 700a, 710a, 720a and 730a, respectively. Additionally, NAND string 700n includes SGS transistor 701, dummy memory cell 702, data memory cells 703-714, dummy memory cell 715 and SGD transistor 716. NAND string 710n includes SGS transistor 721, dummy memory cell 722, data memory cells 723-734, dummy memory cell 735 and SGD transistor 736. NAND string 720n includes SGS transistor 741, dummy memory cell 742, data memory cells 743-754, dummy memory cell 755 and SGD transistor 756. NAND string 730n includes SGS transistor 761, dummy memory cell 762, data memory cells 763-774, dummy memory cell 775 and SGD transistor 776.

This example depicts one SGD transistor at the drain-end of each NAND string, and one SGS transistor at the source-end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

After a block of memory cells is erased in an erase operation, programming can occur in which the memory cells are programmed according to a word line programming order. For example, the programming may start at the word line at the source-side of the block and proceed to the word line at the drain-side of the block, one word line at a time. A word line can also be programmed in a sub-block programming order, extending from SB0 to SB3, for example, when there are four sub-blocks (FIG. 7A). For example, a portion of the memory cells of WLn in SB0 are first programmed, followed by a portion of the memory cells of WLn in SB1, a portion of the memory cells of WLn in SB2 and then a portion of the memory cells of WLn in SB3. WLn refers to a word line selected for programming. A programming operation may include one or more sets of increasing program voltages or pulses which are applied to a word line in respective program loops, also referred to as program-verify iterations, such as depicted in FIG. 12A. Verify tests may be performed after each program voltage to determine whether the memory cells have completed programming. The programming is complete when the memory cells are in an assigned data state as represented by a threshold voltage (Vth) distribution, such as in FIG. 11A or 11B.

FIG. 7B depicts an example view of memory cells connected to WL3 in the sub-block SB0 of FIG. 7A, with respective NAND strings, bit lines and sense circuits. The memory cell 706 and channel 700a of the NAND string 700n in SB0 of FIG. 7A are depicted, along with a respective bit line BL0. SB0 also includes memory cells 706a, 706b and 706c in NAND strings 701n, 702n and 703n, respectively, which have channels 700b, 700c and 700d, respectively, and which are connected to bit lines BL1, BL2 and BL3, respectively. The bit lines BL0-BL3 are connected to the sense circuits 60-63, respectively, of FIG. 2.

In a program loop, the memory cells 706 and 706a could be examples of selected and unselected memory cells, respectively, in which case the NAND strings 700n and 701n are examples of selected and unselected NAND strings, respectively, and the bit lines BL0 and BL1 are examples of selected and unselected bit lines, respectively.

FIG. 7C depicts an example view of the NAND string 700n of FIGS. 7A and 7B, showing overdrive voltages of the channel 700a during a read operation, where WLn=WL3 is the selected word line. The programmed word lines 797 on the source side of WL3 include WL0-WL2, the programmed word lines 796 on the drain side of WL3 include WL4-WL6, where WL6 is the last-programmed word line, and the unprogrammed word lines 795 of the block include WL7-WL95. The source side of a word line is the side facing the source end of the NAND strings and the drain side of a word line is the side facing the drain end of the NAND string.

The programmed word lines are word lines whose memory cells have been programmed in a program operation and the unprogrammed word lines are word lines whose memory cells have not been programmed in a program operation. The memory cells connected to a programmed word line will include both erased state and programmed state memory cells, typically with a random distribution of data states. The memory cells connected to an erased or unprogrammed word line will all be in the erased state. This is due to the entire block being erased before being programmed and read.

During a read operation, the channel of each unselected memory cell will have a read pass voltage (Vread) applied, so that the memory cell has an overdrive based on Vread-Vth, where Vth is the threshold voltage of the memory cell. The overdrive is sufficiently high to cause a channel inversion which provides the unselected memory cells in a strongly conductive state so that the selected memory cell can be sensed without interference from the unselected memory cells in the NAND string. However, the Vth of the memory cells will vary so that the overdrive varies. In particular, the erased memory cells of the unprogrammed word lines will have a relatively high overdrive, compared to the programmed memory cells. As a result, the current in the NAND string can be higher than is optimal, resulting in increased current consumption during sensing operations. A further issue is that the number of unprogrammed word lines can be different in different blocks of a meta-block due to a programming order discussed in connection with FIG. 8D.

Figure 8A:
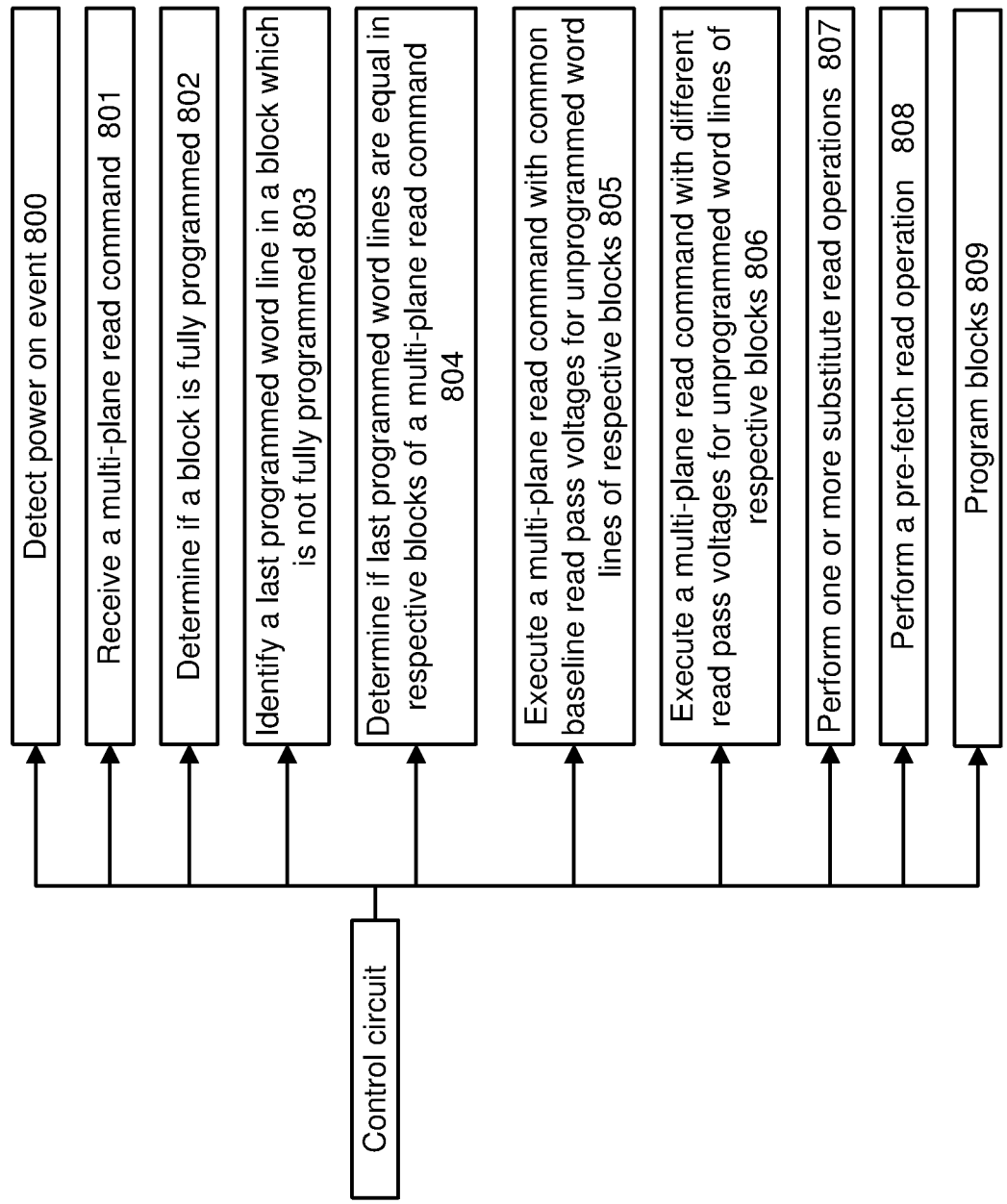
FIG. 8A depicts different processes which can be performed by a control circuit in connection with a read operation which reduces current consumption.

FIG. 8A depicts different processes which can be performed by a control circuit in connection with a read operation which reduces current consumption. The control circuit can include an on-chip circuit such as the control circuitry 110 and/or an off-chip circuit such as the controller 122 in FIG. 1A. The different processes include detecting a power on event 800, receiving a multi-plane read command 801, determining if a block is fully programmed 802, identifying a last-programmed word line in a block which is not fully programmed 803, determining if the last-programmed word lines are equal in respective blocks of a multi-plane read command 804, executing a multi-plane read command with common baseline read pass voltages for unprogrammed word lines of respective blocks 805, executing a multi-plane read command with different read pass voltages for unprogrammed word lines of respective blocks 806, performing one or more substitute read operations 807, e.g., a single-plane read operation or independent read operations, performing a pre-fetch read operation 808, and programming blocks 809. The processes 800-808 are discussed in the examples of FIGS. 8B and 8C, and the process 809 is discussed in the example of FIG. 8D.

Figure 8B:
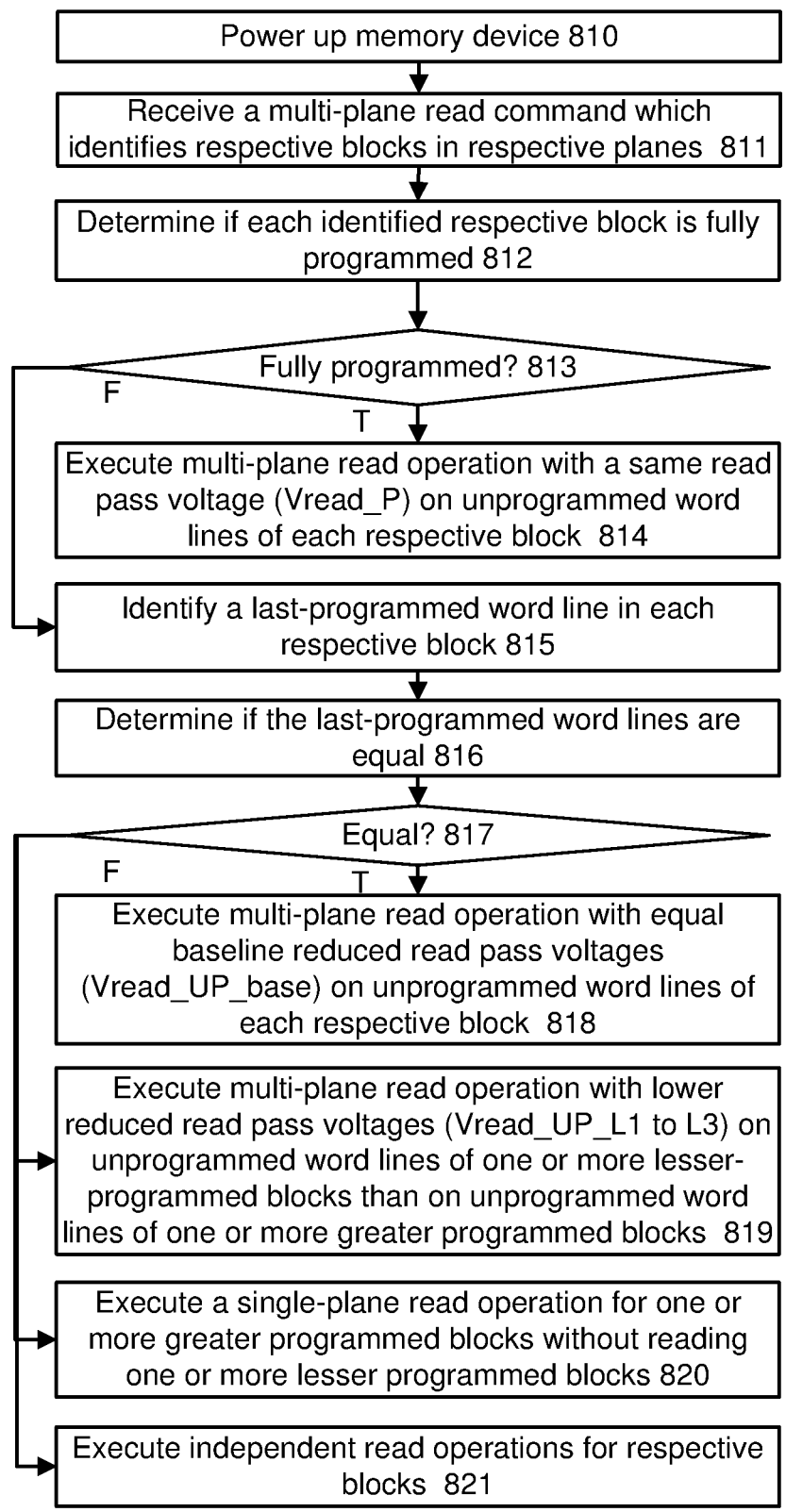
FIG. 8B depicts an example read process consistent with FIG. 8A.

FIG. 8B depicts an example read process consistent with FIG. 8A. Step 810 includes powering up a memory device.

Typically a power on event is detected by the control circuit. Step 811 includes receiving a multi-plane read command which identifies respective blocks in respective planes. For example, the read command can be issued by the host 140. The read command may identify a same selected word line in each of the respective blocks and a same page type, e.g., lower, middle or upper, when multi-level cells are used.

Step 812 includes determining if each identified respective block is fully programmed. In one approach, the control circuit accesses a table such as in FIG. 8E to make this determination. This table can be stored in a non-volatile location so that it is maintained after the memory device powers off and then back on. In an embodiment, the L2P table is stored in the memory structure 126 of FIG. 1A. A decision step 813 determines if each block identified in the read command is fully programmed. If the decision step 813 is true, step 814 executes the multi-plane read command with a same read pass voltage (Vread_P) on unprogrammed word lines of each respective block identified in the read command.

If the decision step 813 is false, step 815 identifies a last-programmed word line in each respective block identified in the read command. For example, a binary search process can be performed which can include, e.g., reading a word line which is halfway between the first and last word lines of a block to determine which half of the block contains the last-programmed word line. For example, if the halfway word line is programmed, this means the last-programmed word line is between the halfway word line and the last word line of the block. The block is then divided up further to determine which ¼, ⅛ ¹⁄₁₆ and so on of the block contains the last-programmed word line, until the last-programmed word line is identified. Another technique is to read each word line one at a time, starting from an edge word line of the block, until a transition between a programmed word line and an unprogrammed word line is detected. The identity of the last-programmed word lines can be stored in the table of FIG. 8E. In an embodiment, the information of last-programmed word lines is stored in the volatile memory 122*b* of FIG. 1A. The information disappears when a sudden power off event occurs.

Step 816 determines if the last-programmed word lines in the block are equal. For example, in FIG. 7C, WL6 is the last-programmed word line. Step 816 would then determine if WL6 was the last-programmed word line in each block identified in the read command. The table of FIG. 8E could be used for this purpose. At decision step 817, if the last-programmed word lines are equal, step 818 executes the multi-plane read command with equal reduced baseline read pass voltages, e.g., Vread_UP_base (lower than Vread_P of step 814) on unprogrammed word lines of each respective block identified in the read command. See FIG. 9A.

If the decision step 817 is false, the last-programmed word lines are not equal for each respective block identified in the read command. See FIG. 9B-9D. Three options are depicted. In a first option, step 819 includes executing the multi-plane read operation with lower reduced read pass voltages, e.g., Vread_UP_L1, Vread_UP_L2 and Vread_UP_L3 (lower than Vread_UP_base of step 818) on unprogrammed word lines of one or more lesser-programmed blocks than on unprogrammed word lines of one or more greater-programmed blocks. A lesser-programmed block is a block whose last-programmed word line is closer to its first programmed word line, compared to the distance of a last-programmed word line to a first programmed word line in a greater-programmed block. The approach of step 819 can increase the complexity of the chip but allow faster validation of the memory device.

In a second option, step 820 includes executing a single-plane read operation for one or more greater-programmed blocks without reading the one or more lesser-programmed blocks. Current consumption is reduced when the one or more lesser-programmed blocks are inactive while the one or more greater-programmed blocks are read. Potentially, each block identified in the read operation can be read in turn in a single-plane read operation.

In a third option, step 821 includes executing independent read operations for the respective blocks.

Figure 8C:
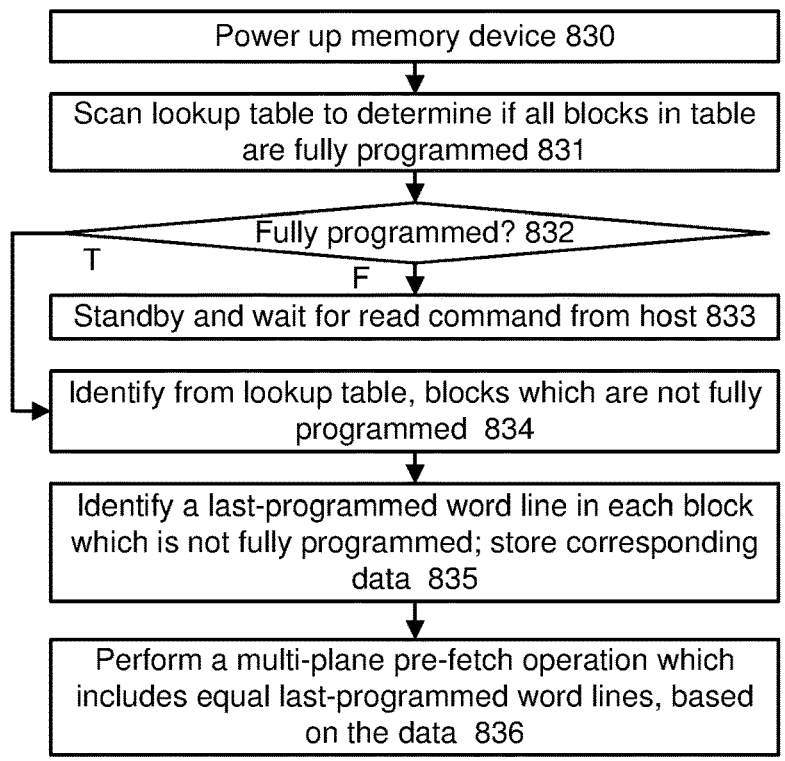
FIG. 8C depicts another example read process consistent with FIG. 8A.

FIG. 8C depicts another example read process consistent with FIG. 8A. Step 830 includes powering up the memory device. Step 831 includes scanning the lookup table, e.g., of FIG. 8E, to determine if all blocks in the table are fully programmed. This occurs before specific blocks are identified by a read command. A decision step 832 determines if the blocks are fully programmed. If the decision step 832 is true, step 833 indicates that the control circuit enters a standby mode and waits for a read command from the host. If the decision step 832 is false, step 834 identifies from the lookup table, blocks which are not fully programmed. Step 835 identifies a last-programmed word line in each block which is not fully programmed, and stores corresponding data, e.g., in the table of FIG. 8E. Step 836 involves performing a multi-plane pre-fetch operation which includes equal last programmed word lines, based on the data.

A pre-fetch operation is performed in preparation for a read command and can include instructions or data which a control circuit may need to respond to the read command. A pre-fetch operation can involve retrieving data from a slower memory to a faster memory. For example, the slower memory can be a solid-state drive comprising blocks of non-volatile memory cells such as in FIG. 4, while the faster memory can be a volatile memory such as RAM. See, e.g., the RAM 122*b* in FIG. 1A.

Figure 8D:
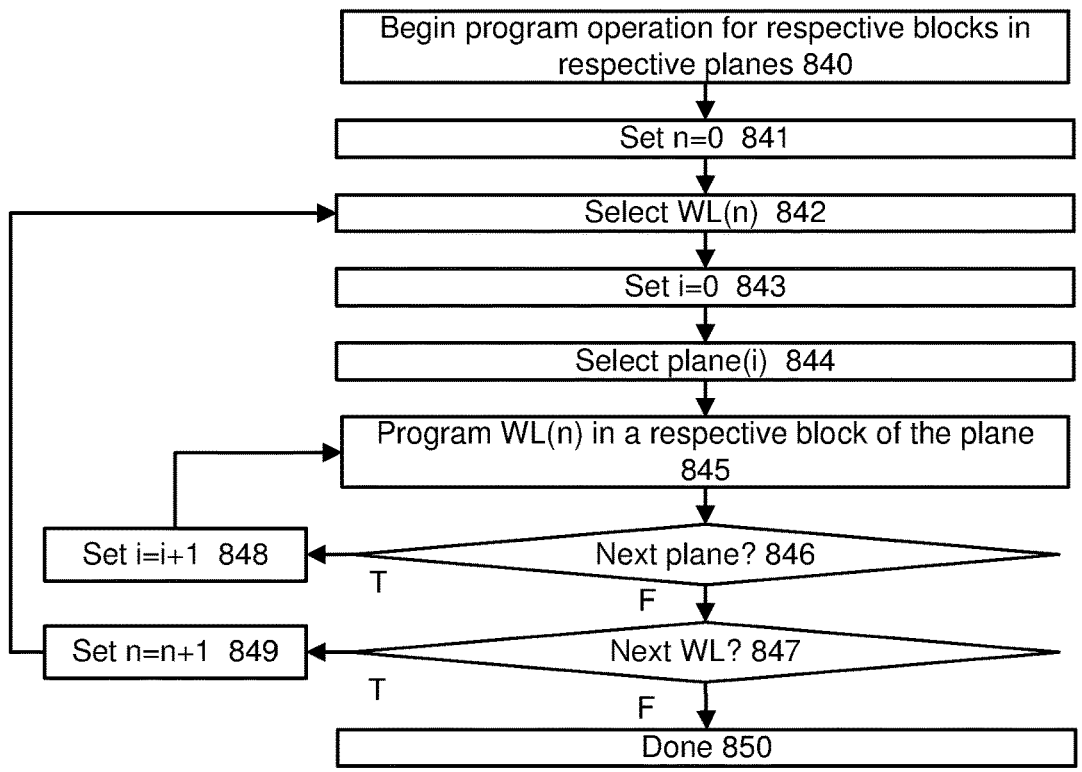
FIG. 8D depicts an example programming operation consistent with FIG. 8A, step 809.

FIG. 8D depicts an example programming operation consistent with FIG. 8A, step 809. When respective blocks are arranged in a meta-block, the programming can involve WL0 in each respective block in turn, WL1 in each respective block in turn and so forth. Depending on the amount of data being programmed, the program operation can end when the respective blocks are unequally programmed, as in FIG. 9B-9D. Some blocks will be greater-programmed blocks and others will be lesser-programmed blocks. This can result in increased current consumption, as discussed. Or, the program operation can end when the respective blocks are equally programmed, as in FIG. 9A.

Step 840 begins a program operation for respective blocks in respective planes. Step 841 sets a word line index n=0 to denote the first word line in each block. Step 842 selects WL(n) to be programmed. Step 843 sets a plane index i=0 to denote the first plane, P0. Step 844 selects plane(i) to be programmed. Step 845 programs WL(n) in plane(i) in a respective block of the plane. If a decision step 846 indicates there is a next plane to program, step 848 increments the plane index i and step 845 programs the same word line in the next plane. If the decision step 846 indicates there is no next plane to program, a decision step 847 determines if there is a next word line (WL) to program. If the decision step 847 is true, step 849 increments the WL index n and step 842 selects the next word line. If the decision step 847 is false, step 850 indicates the program operation is done.

FIG. 8E depicts an example table 119 maintained by the RAM 122*b* of FIG. 1A for use in connection with FIG. 8A-8D. As mentioned, the table can store data indicating whether a block is fully programmed. The data can be obtained and stored for all blocks, prior to receiving a read command, or for selected blocks identified by a read command. The table can also store data identifying a last-programmed word line. In some cases, the information about whether a block is fully programmed is stored in a non-volatile memory so that it is available upon power up of the chip, while the identification of a last-programmed block is stored in a volatile memory so that it is lost after a power cycle and has to be determined again.

In an example implementation, the table includes a first column which identifies the blocks, e.g., B0-0 to B0-$n$-1, B1-0 to B1-$n$-1, B2-0 to B2-$n$-1 and B3-0 to B3-$n$-1, consistent with FIG. 4. A second column can include a bit indicating whether a block is fully programmed, e.g., 0 for no and 1 for yes. A third column can identify a last programmed word line. In this example, B0-0, B1-0, B2-0 and B3-0, consistent with the meta-block of FIG. 4, have a last-programmed word line or boundary word line referred to as WLb(P0), WLb(P1), WLb(P2) and WLb(P3), respectively.

In one approach, a control circuit is configured to perform multiple programming cycles, where each programming cycle programs one word line in each respective block in a programming order so that the last-programmed word line of the one or more lesser-programmed blocks is one word line away from the last-programmed word line of the one or more greater-programmed blocks in the programming order.

See also FIG. 9A-9D which depicts word lines WL0(P0)-WL95(P0), WL0(P1)-WL95(P1), WL0(P2)-WL95(P2) and WL0(P3)-WL95(P3) for blocks B0-0, B1-01, B2-0 and B3-0, respectively. Each word line is labelled in a block, starting at WL0 and ending at WL95, for example. Additionally, a boundary word line, or last-programmed word line, is depicted as WLb. In some case, one or more neighboring word lines near the boundary word line are also depicted. A long-dashed line box denotes blocks which have a same read pass voltage for unprogrammed word lines. Also, the selected word lines WLn(P0)-WLn(P3) are programmed word lines other than the last-programmed word lines in the respective blocks in this example.

For the word lines, a dotted-line box denotes an unprogrammed word line and a solid line box denotes a programmed word line. WLn is the selected word line being read and receives Vcgr, a control gate read voltage. Its adjacent word lines, WLn−1 and WLn+1 receive an elevated read pass voltage, VreadK, in this example. The remaining programmed word lines receive Vread_P (P denotes programmed). The unprogrammed word lines receive a version of Vread_UP (UP denotes unprogrammed). The relative values of the voltages can be seen in the examples of FIGS. 10A and 10B. In one approach, VreadK>Vread_P> Vread_UP_base>Vread_UP_L1>Vread_UP_L2>Vread_UP_L3> Vcgr.

Figure 9B:
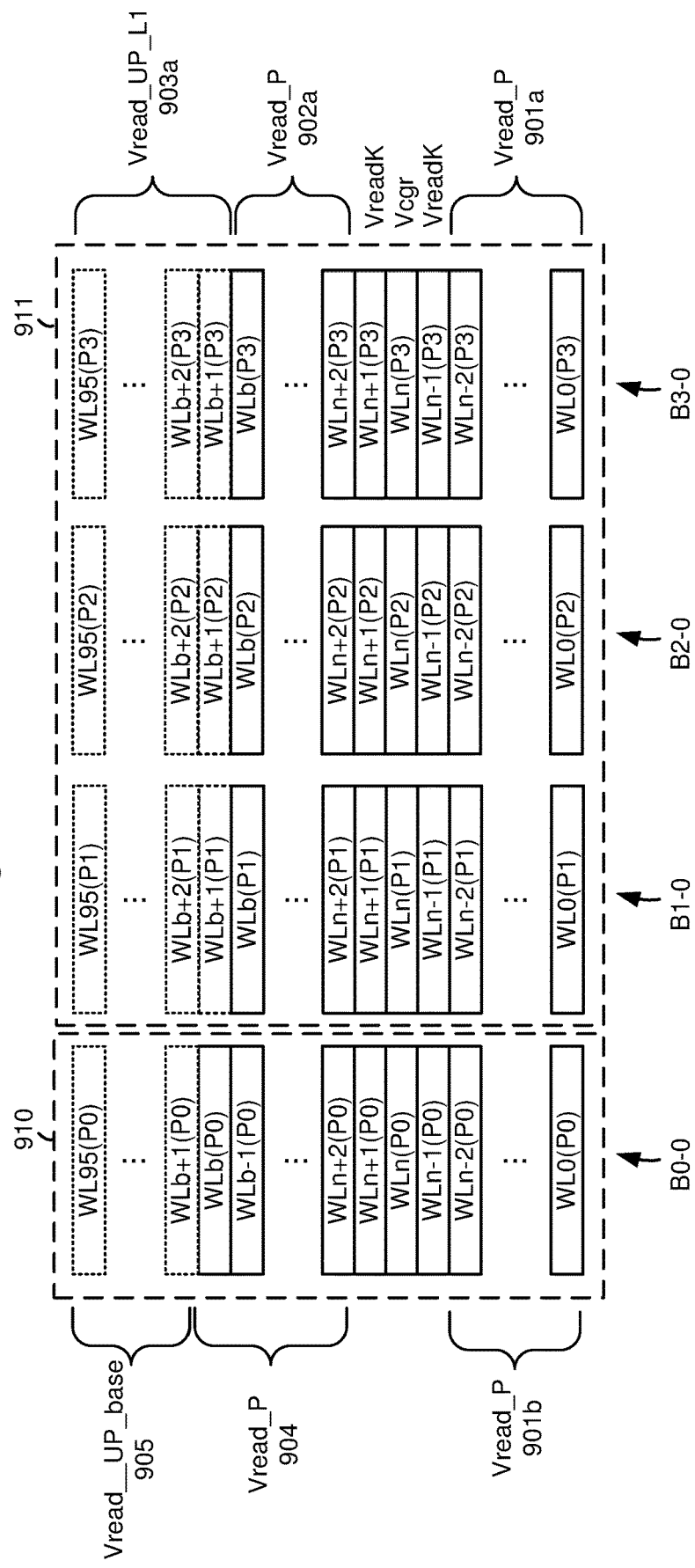
FIG. 9B depicts a second example configuration of the set of respective blocks B0-0 to B0-3, where the block B0-0 has a higher boundary word line than the blocks B1-0 to B3-0, and a lower read pass voltage, Vread_UP_L1, is applied to unprogrammed word lines of B1-0 to B3-0.

FIG. 9A depicts a first example configuration of the set of respective blocks B0-0 to B0-3, where the blocks have a same boundary word line and a common read pass voltage, Vread_UP_base, is applied to unprogrammed word lines. The boundary word lines WLb(P0)-WLb(P3) are all in the same relative position in their blocks, in the set of blocks 900. Vread_P is applied to a set of programmed word lines 901 on a source side of WLn and a set of programmed word lines 902 on a drain side of WLn. A baseline read pass voltage Vread_UP_base is applied to a set of unprogrammed word lines 903. Vread_UP_base is the highest Vread voltage for the unprogrammed word lines in FIG. 9A-9D. The blocks are all equally programmed in this example.

FIG. 9B depicts a second example configuration of the set of respective blocks B0-0 to B0-3, where the block B0-0 has a higher boundary word line WLb(P0) than the boundary word lines WLb(P1)-WLb(P3) of the blocks B1-0 to B3-0, respectively, and a lower read pass voltage, Vread_UP_L1, is applied to unprogrammed word lines of B1-0 to B3-0. In particular, WLb(P0) is one word line apart from WLb(P1)-WLb(P3). That is, WLb(P0) is one word line closer to the last word line, WL95, compared to the distance between WLb(P1)-WLb(P3) and WL95. This is due to the programming technique of FIG. 8D, as discussed. Vread_UP_L1 is lower than Vread_UP_base.

Specifically, Vread_P is applied to sets of programmed word lines 901a and 902a in a set of blocks 911 comprising B1-0 to B3-0. Vread_UP_L1 is applied to a set of unprogrammed word lines 903a in the set of blocks 911. Vread_P is applied to sets of programmed word lines 901b and 904 in B0-0 (910). Vread_UP_base is applied to a set of unprogrammed word lines 905 in B0-0. B0-0 is a greater-programmed block and B1-0 to B3-0 are lesser-programmed blocks in this example.

Figure 9C:
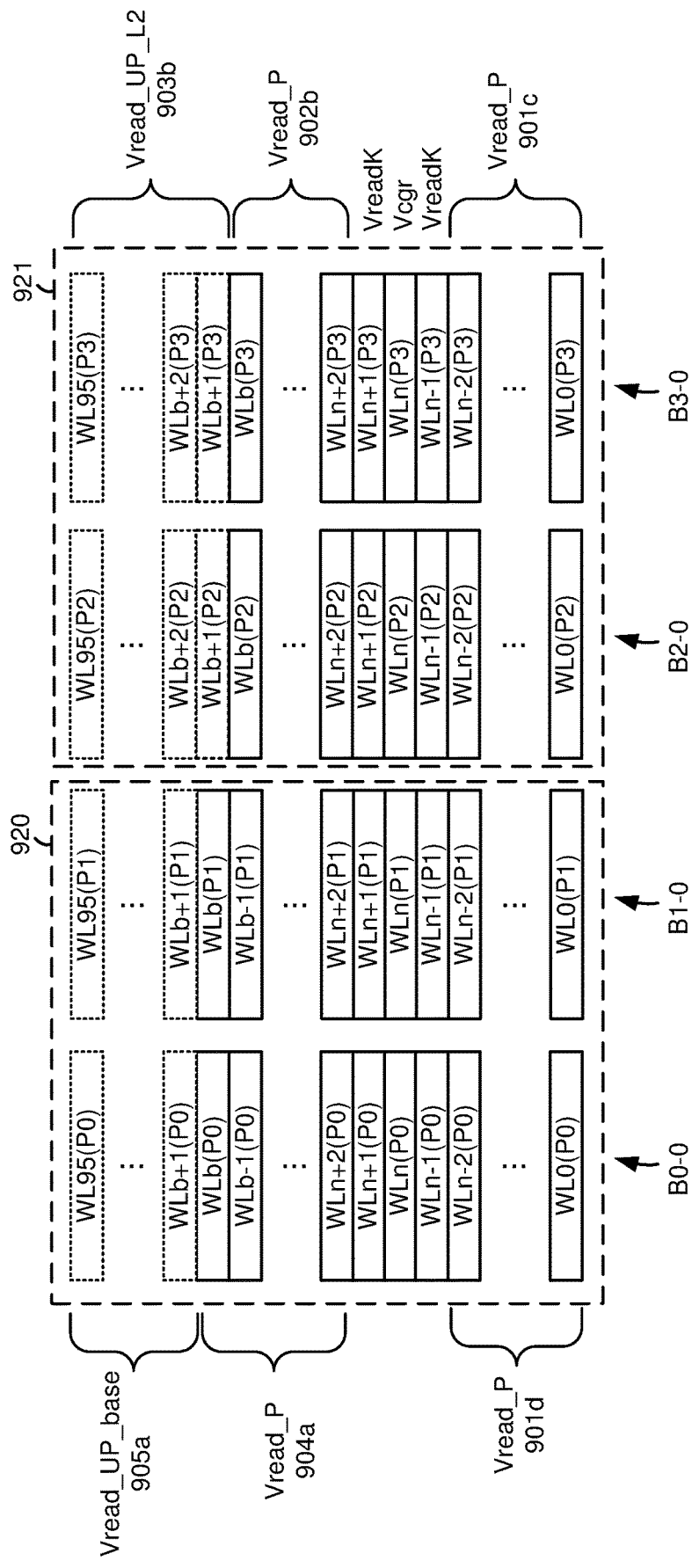
FIG. 9C depicts a third example configuration of the set of respective blocks B0-0 to B0-3, where the blocks B0-0 and B1-0 have a higher boundary word line than the blocks B2-0 and B3-0, and a lower read pass voltage, Vread_UP_L2, is applied to unprogrammed word lines of B2-0 and B3-0.

FIG. 9C depicts a third example configuration of the set of respective blocks B0-0 to B0-3, where the blocks B0-0 and B1-0 have a higher boundary word line WLb(P0) and WLb(P1), respectively, than the boundary word lines WLb(P2) and WLb(P3) of the blocks B2-0 and B3-0, and a lower read pass voltage, Vread_UP_L2, is applied to unprogrammed word lines of B2-0 and B3-0. Vread_UP_L2 is lower than Vread_L1.

Specifically, Vread_P is applied to sets of programmed word lines 901c and 902b in a set of blocks 921 comprising B2-0 and B3-0. Vread_UP_L2 is applied to a set of unprogrammed word lines 903b in the set of blocks 921. Vread_P is applied to sets of programmed word lines 901d and 904a in a set of blocks 920 comprising B0-0 and B1-0. Vread_UP_base is applied to a set of unprogrammed word lines 905a in the set of blocks 920. B0-0 and B1-0 are greater-programmed blocks and B2-0 and B3-0 are lesser-programmed blocks in this example.

Figure 9D:
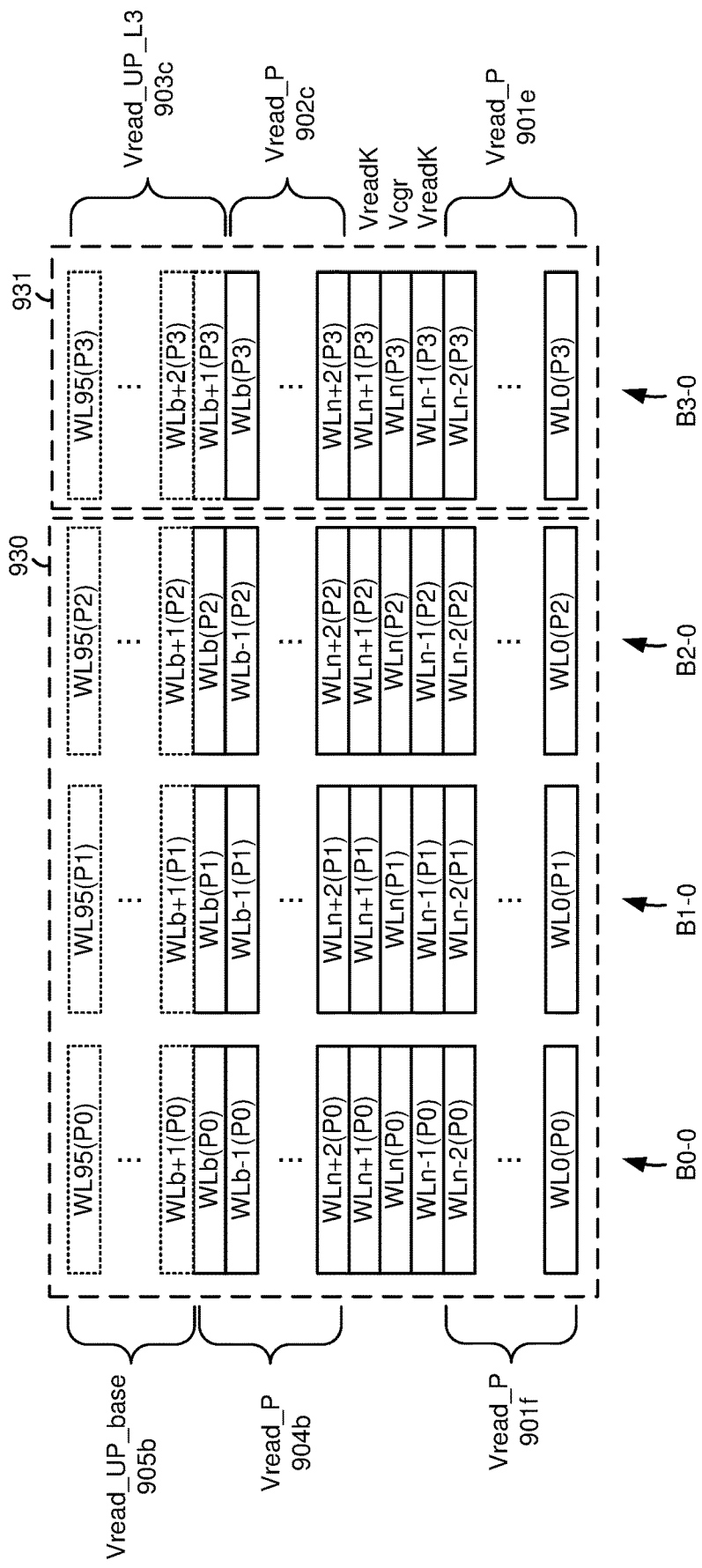
FIG. 9D depicts a fourth example configuration of the set of respective blocks B0-0 to B0-3, where the blocks B0-0 to B2-0 have a higher boundary word line than the block B3-0, and a lower read pass voltage, Vread_UP_L3, is applied to unprogrammed word lines of B3-0.

FIG. 9D depicts a fourth example configuration of the set of respective blocks B0-0 to B0-3, where the blocks B0-0 to B2-0 have a higher boundary word line WLb(P0)-WLb(P2), respectively, than the boundary word line WLb(P3) of the block B3-0, and a lower read pass voltage, Vread_UP_L3, is applied to unprogrammed word lines of B3-0. Vread_UP_L3 is lower than Vread_L2.

Specifically, Vread_P is applied to sets of programmed word lines 901e and 902c in the block B3-0. Vread_UP_L3 is applied to a set of unprogrammed word lines 903c in the set of blocks 931 comprising B3-0. Vread_P is applied to sets of programmed word lines 901f and 904b in a set of blocks 930 comprising B0-0 to B2-0. Vread_UP_base is applied to a set of unprogrammed word lines 905b in the set of blocks 930. B0-0 to B2-0 are greater-programmed blocks and B3-0 is a lesser-programmed block in this example.

Figure 10A:
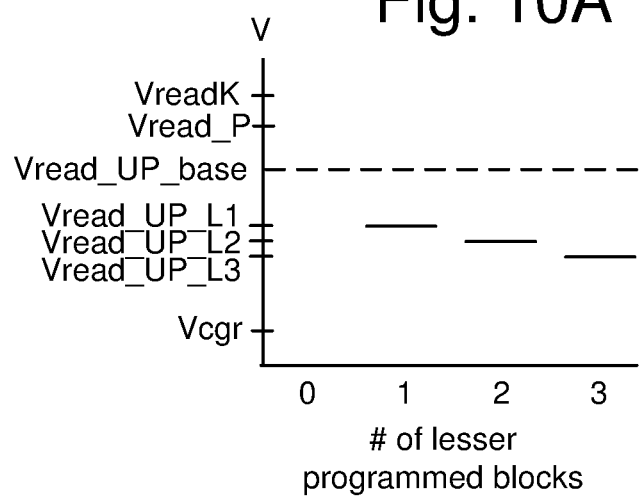
FIG. 10A depicts a plot of a read pass voltages for unprogrammed word lines as a function of a number of lesser-programmed blocks, consistent with FIG. 9A-9D, where the read pass voltage is lower when the number of lesser-programmed blocks is greater.

FIG. 10A depicts a plot of a read pass voltages for unprogrammed word lines as a function of a number of lesser-programmed blocks, consistent with FIG. 9A-9D, where the read pass voltage is lower when the number of lesser-programmed blocks is greater. In FIG. 9A-9D, the number of lesser-programmed blocks is 0-3, respectively. The read pass voltage for the unprogrammed word lines can be reduced for the lesser-programmed blocks to counteract the increased current consumption which would otherwise occur. As mentioned, reducing the read pass voltage reduces the overdrive so that the current is also reduced. The read pass voltages are still sufficiently high to provide the associated unselected memory cells in a conductive state to allow sensing to occur for the selected memory cells.

FIG. 10A indicates that the lower read pass voltage (Vread_UP_L1, Vread_UP_L2 or Vread_UP_L3) is relatively low when a number of the lesser-programmed blocks is relatively high. The relative magnitudes of Vread_UP_base, Vread_P and VreadK are also depicted.

Figure 10B:
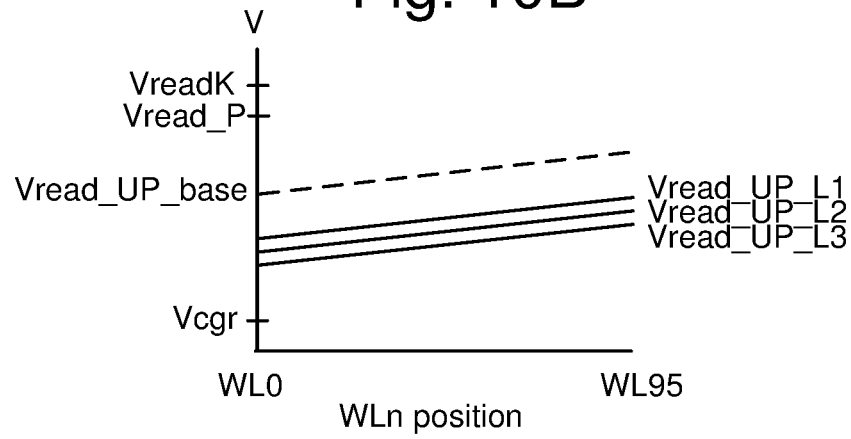
FIG. 10B depicts a plot of read pass voltages for unprogrammed word lines as a function of the WLn position, consistent with FIG. 9A-9D, where the read pass voltage is higher when the WLn position is closer to the last-programmed word line.

FIG. 10B depicts a plot of read pass voltages for unprogrammed word lines as a function of the WLn position, consistent with FIG. 9A-9D, where the read pass voltage is higher when the WLn position is closer to the last-programmed word line. When the WLn position is closer to the last-programmed word line, there is a relatively smaller number of unprogrammed word lines. As a result, there is a reduced need to reduce the overdrive voltage, so that the read pass voltage can be larger. Vread_UP_base, Vread_UP_L1, Vread_UP_L2 and Vread_UP_L3 can each increase as the WLn position is closer to the last word line.

When the WLn position is relatively close to the first word line, the number of unprogrammed word lines is relatively high. Accordingly, FIG. 10B indicates that the lower read pass voltage is relatively low when a number of the unprogrammed word lines of the lesser-programmed blocks is relatively high. Also, the baseline read pass voltage Vread_UP_base is relatively low when a number of the unprogrammed word lines of the respective blocks is relatively high.

Figure 11A:
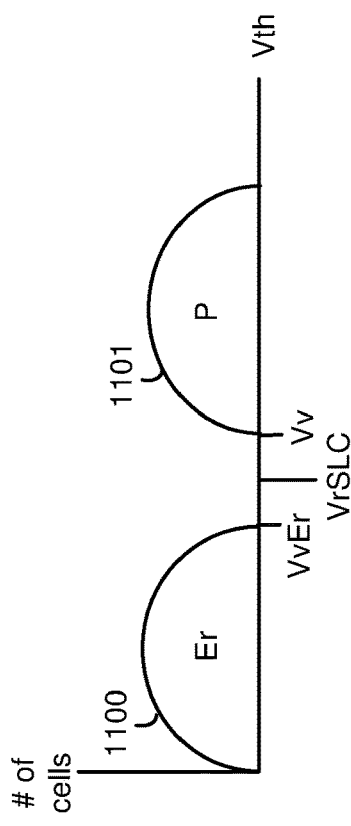
FIG. 11A depicts example Vth distributions of a set of memory cells with one bit per cell and two data states.
Figure 11B:
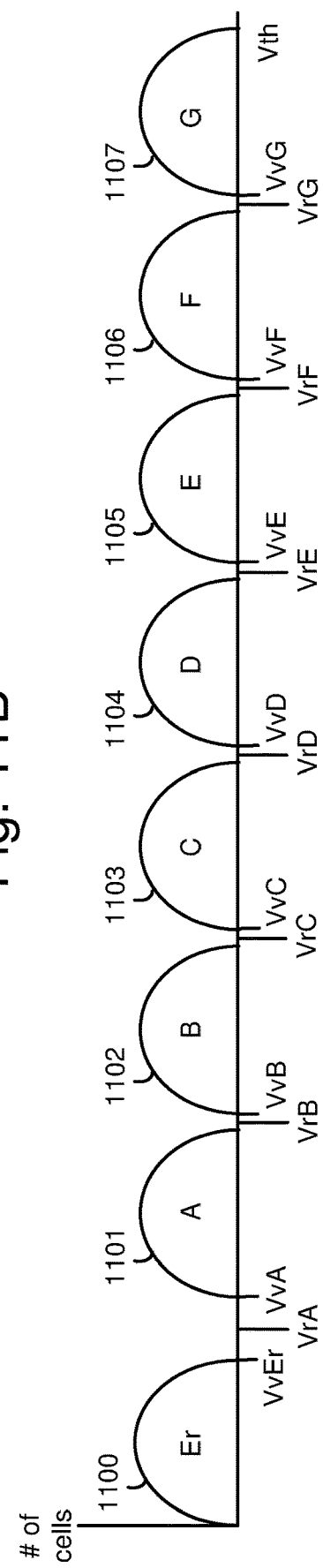
FIG. 11B depicts example Vth distributions of a set of memory cells with three bits per cell and eight data states.

FIG. 11A depicts example Vth distributions of a set of memory cells with one bit per cell and two data states. In FIGS. 11A and 11B, the vertical axis depicts a number of memory cells on a logarithmic scale, and the horizontal axis depicts a Vth of the memory cells on a linear scale. The techniques provided herein can be used with both single level cells and multi-level cells.

Each memory cell may be associated with a data state according to write data in a program command. Based on its data state, a memory cell will either remain in the erased (Er) state or be programmed to a programmed data state. For example, in a one bit per cell memory device, there are two data states including the erased state and the programmed state. In a two-bit per cell memory device, there are four data states including the erased state and three programmed data states referred to as the A, B and C data states. In a three-bit per cell memory device, there are eight data states including the erased state and seven programmed data states referred to as the A, B, C, D, E, F and G data states. In a four-bit per cell memory device, there are sixteen data states including the erased state S0 and fifteen programmed data states S1-S15. Each data state can be represented by a range of threshold voltages (Vth) in the memory cells.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. Moreover, during the read operation, the voltages of the unselected word lines are ramped up to a read pass level or turn on level which is high enough to place the unselected memory cells in a strongly conductive state, to avoid interfering with the sensing of the selected memory cells. A word line which is being programmed or read is referred to as a selected word line, WLn.

In a program operation with one bit per cell, the memory cells either remain in an erased state (Er) as represented by a Vth distribution 1100, or are programmed to a programmed state (P), as represented by a Vth distribution 1101. The programming can use a verify voltage Vv and one or more program pulses. The Vth distribution 1100 of the Er state can be obtained in an erase operation which use the verify voltage VvEr. A control gate read voltage VrSLC can be used to read the memory cells after programmed is completed. See also FIG. 14D.

FIG. 11B depicts example Vth distributions of a set of memory cells with three bits per cell and eight data states. In one approach, at a start of a program operation, the memory cells are all initially in the erased (Er) state, as represented by the Vth distribution 1100. After the program operation is successfully completed, the memory cells assigned to the A-G states are represented by the Vth distributions 1101-1107 which have associated verify voltages of VvA-VvG, respectively. Read voltages VrA-VrG can be used for reading the states of the memory cells in a read operation.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase-verify voltage, VvEr, which is applied to the word lines.

The Er-G states are examples of assigned data states, and the A-G states are examples of programmed data states, in this eight-state example.

For multi-level and single-level memory cells, a multi-plane read operation is typically performed unless the device enters an exception mode due to a high bit error rate. In this case, a single-plane read operation can be used. In some cases, a partially programed block can be closed after a period of time by moving its data to another block. This is particularly true for a block of multi-level cells, and helps in managing the blocks. For single-level cells, which are intended to provide high access rates, maintaining some of the cells in an erased state helps reduce the latency during write operations.

FIG. 12A depicts an example voltage signal used in a program operation, consistent with FIGS. 8D and 11B. The voltage signal 1200 includes a set of program pulses, including an initial program pulse 1201, which are applied to a word line selected for programming. The initial program pulse has a voltage Vpgm_init, and dVpgm denotes the step size between successive program pulses. A single program pass is used having fifteen program loops, as an example. The verify signals in each program loop, including example verify signals 1202, can encompass lower assigned data states, then midrange assigned data states and then higher assigned data states as the program operations proceeds, as depicted in FIG. 12B. See also the signals of FIG. 13 for example details of a program loop.

The example verify signals depict three verify voltages as a simplification. A verify signal is applied to a selected word line during a program loop after the application of a program pulse to the selected word line. Memory cells are sensed during the application of the verify signal in a verify test to judge their programming progress. A verify signal includes one or more voltages which are used to judge whether the memory cell has completed programming to an assigned data state. The result of sensing of the Vth relative to a verify voltage can be used to inhibit further programming of a memory cell.

The data which is programmed or read can be arranged in pages. For example, with two bits per cell, two pages of data can be stored in the memory cells connected to a word line. The data of the lower and upper pages can be determined by reading the memory cells using read voltages of VrA and VrC; and VrB, respectively.

With three bits per cell, three pages of data can be stored in the memory cells connected to a word line. The data of the lower, middle and upper pages can be determined by reading the memory cells using read voltages of VrA and VrE; VrB; and VrC and VrG, respectively. See also FIG. 14A-14C.

FIG. 12B depicts an example of verify voltages used in the different program loops of FIG. 12A. The horizontal bars are time-aligned with the program loop axis of FIG. 12A. The bars overlap in some program loops, indicating that verify operations can be performed for multiple data states in the program loop. With eight data states, the bars indicate that verify voltages for the A, B, C, D, E, F and G states are applied in program loops 1-4, 3-6, 5-8, 7-10, 9-12, 11-14 and 12-15, respectively.

In one approach, the program loops in which the verify tests are performed are predetermined, before the program operation. In another approach, the program loops in which the verify tests are performed are determined adaptively as the programming progresses. For example, the B state verify tests may begin in a next program loop after a specified portion of the A state memory cells have passed their verify test.

FIG. 13 depicts example voltage signals for performing a program operation, consistent with FIG. 12A. The vertical dimension denotes voltage and the horizontal dimension denotes time, with time points t0-t12. The period of time depicted corresponds to one program loop and includes a pre-charge phase 1307 (t0-t2), a program phase 1308 (t2-t8) and a verify phase 1309 (t9-t12). Voltage signals 1300, 1310, 1320, 1330 and 1340 depict VWLn, VWL_unsel, Vsg, Vbl and Vsl, respectively.

In the pre-charge phase, VWLn and VWL_unsel can be set to a pre-charge voltage, e.g., 1-2 V.

For the bits lines of the unselected NAND strings, a program-inhibit voltage signal (plot 1331) is ramped up from 0 V to 2 V, for instance, at t0 to provide a small amount of channel boosting in the pre-charge phase and to inhibit programming in the program phase. For the bit lines of the selected NAND string, a fixed voltage such as 0 V (plot 1332) is applied to avoid channel boosting in the pre-charge phase and to allow programming to occur in the program phase. The program-enable voltage signal at 0 V is depicted by the plot 1342.

The SGD transistors of the selected and unselected sub-blocks are in a conductive state at this time, with a voltage of Vsg=6 V, for example. This allows the bit line voltage to be passed to the channel. The SGS transistors of the selected and unselected sub-blocks can also be in a conductive state at this time, with a voltage of 6 V, for example to allow Vsl=1 V to be passed to the source end of the channel.

Vsgd is set to 6 V to pass the bit line voltage to the drain ends of the NAND strings. In the program phase, VWLn and Vw1_unsel are ramped up, e.g., starting at t3, to provide a capacitive coupling up of the channels of the inhibited NAND strings. VWLn is then ramped up further at t5 to the peak program pulse level of Vpgm (plot 1301) and held at Vpgm until t4. After the application of the program pulse, the word line voltages are ramped down in a recovery process. During the program pulse, Vsgd for the selected sub-block, Vsgd_sel (plot 1321), is high enough to provide the selected SGD transistors in a conductive state for the selected NAND strings, which receive Vbl_sel=0 V, but low enough to provide the selected SGD transistors in a non-conductive state for the inhibited NAND strings, which receive Vbl_unsel=2 V. Vsgd for the unselected sub-blocks, Vsgd_unsel (plot 1322) can be set to 0 V to provide the corresponding SGD transistors in a non-conductive state.

Subsequently, in the verify phase, one or more verify tests are performed by applying a verify signal (plot 1302) with one or more verify voltages on WLn and, for each verify voltage, sensing the conductive state of the memory cells in the selected NAND strings of the selected sub-block. The SGD and SGS transistors are in a strongly conductive state to allow sensing to occur for the selected memory cells. During the verify tests, Vbl_sense=0.5 V is applied to the bit lines.

The voltages depicted are examples.

Figure 14A:
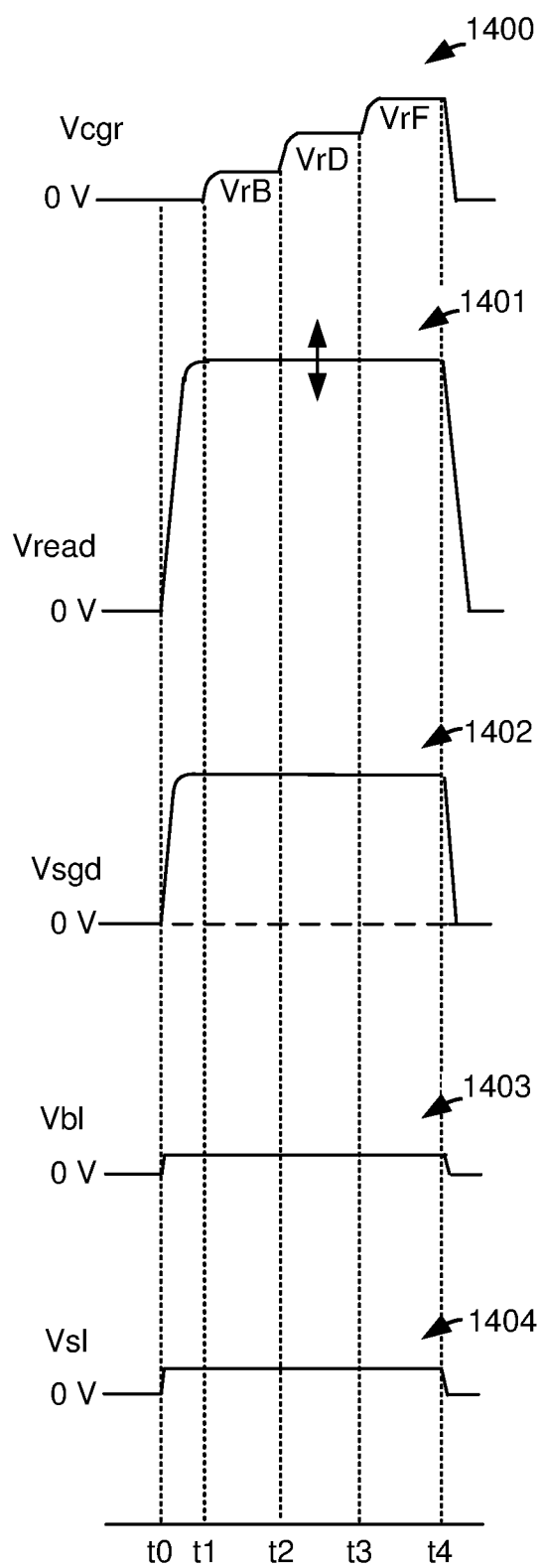
FIG. 14A depicts example voltage signals (plots 1400-1404) for performing a read operation for a middle page of data, consistent with FIGS. 8A-8C and 11B.

FIG. 14A depicts example voltage signals (plots 1400-1404) for performing a read operation for a middle page of data, consistent with FIGS. 8A-8C and 11B. The voltage signal 1400 depicts Vcgr, the voltage applied to the selected word line, WLn. The voltage increases to VrB, VrD and VrF. Sensing occurs during each value of Vcgr to determine the data of the middle page. Vread denotes the read pass voltages applied to the unselected word lines. Vread can have different magnitudes, as discussed. Vsgd denotes the SGD voltage and is set at a high level to provide the SGD transistors in a conductive state. Vbl denotes the bit line voltage and is set at a level such as 0.5 V as part of the sensing process. Vsl denotes the source line voltage and can be set at a small positive voltage, in one approach.

Figure 14B:
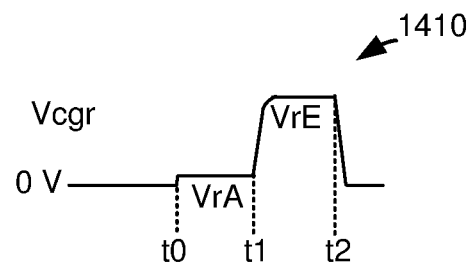
FIG. 14B depicts example voltage signals for performing a read operation for a lower page of data, consistent with FIGS. 8A-8C and 11B.
Figure 14C:
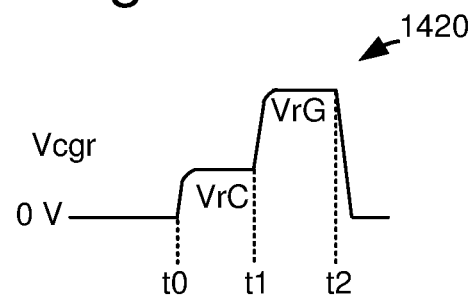
FIG. 14C depicts example voltage signals for performing a read operation for an upper page of data, consistent with FIGS. 8A-8C and 11B.
Figure 14D:
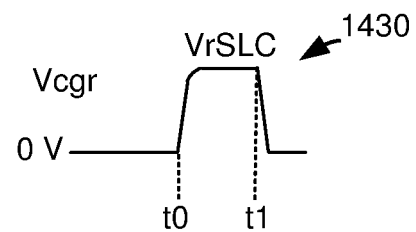
FIG. 14D depicts example voltage signals for performing a read operation for a page of data, consistent with FIGS. 8A-8C and 11A.

FIG. 14B depicts example voltage signals for performing a read operation for a lower page of data, consistent with FIGS. 8A-8C and 11B. The plot 1410 indicates that Vcgr increases to VrA and VrE. Sensing occurs during each value of Vcgr to determine the data of the lower page. In FIG. 14B-14D, Vread, Vsgd, Vbl and Vsl can be similar to the values in FIG. 14A.

FIG. 14C depicts example voltage signals for performing a read operation for an upper page of data, consistent with FIGS. 8A-8C and 11B. The plot 1420 indicates that Vcgr increases to VrC and VrG. Sensing occurs during each value of Vcgr to determine the data of the upper page.

FIG. 14D depicts example voltage signals for performing a read operation for a page of data, consistent with FIGS. 8A-8C and 11A. The plot 1430 indicates that Vcgr increases to VrSLC at which time sensing occurs to determine the data of a single page.

Accordingly, it can be see that in one implementation, an apparatus comprises: a plurality of planes arranged on one or more die; a plurality of blocks of memory cells arranged in the plurality of planes, the plurality of blocks comprise a respective block arranged in each plane, each respective block comprising a set of memory cells connected to a set of word lines, the set of word lines in each respective block comprise programmed word lines and unprogrammed word lines; and a control circuit. The control circuit is configured to: receive a read command identifying a selected word line of each respective block, and in response to the read command, identifying a last-programmed word line for each respective block, and determine whether the last-programmed word line is equal for each respective block; if the last-programmed word line is equal for each respective block, read the selected word lines of the respective blocks by applying a control gate read voltage to the selected word line and a same baseline read pass voltage to the unprogrammed word lines of each respective block; and if the last-programmed word line is not equal for each respective block, identify one or more lesser-programmed blocks of the respective blocks and one or more greater-programmed blocks of the respective blocks based on the last-programmed word lines of the respective blocks, and read the selected word lines of the respective blocks by applying a control gate read voltage to the selected word lines while applying a lower read pass voltage, lower than the same baseline read pass voltage, to the unprogrammed word lines of the one or more lesser-programmed blocks.

In another implementation, a method comprises: receiving a multi-plane read command, the multi-plane read command identifying a selected word line of a respective block in each plane of a plurality of planes, each respective block comprising a set of memory cells connected to a set of word lines, the set of word lines in each respective block comprise programmed word lines and unprogrammed word lines; in response to the multi-plane read command, identifying a last-programmed word line for each respective block, and determining whether the last-programmed word line is equal for each respective block; if the last-programmed word line is equal for each respective block, executing the multi-plane read command by concurrently reading the selected word line of the respective block in each plane; and if the last-programmed word line is not equal for each respective block, performing one or more substitute read operations in place of the multi-plane read command.

In another implementation, an apparatus comprises: a plurality of planes, a plurality of blocks of memory cells arranged in the plurality of planes, each block comprising a set of memory cells connected to a set of word lines; a look up table storing data indicating whether each respective block is fully programmed; and a control circuit. The control circuit is configured to, in response to a power up event, access the lookup table to identify blocks that are not fully programmed, identify a last-programmed word line for each block which is not fully programmed, and store data identifying the last-programmed word lines.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising;
a plurality of planes arranged on one or more die;
a plurality of blocks of memory cells arranged in the plurality of planes, the plurality of blocks comprise a respective block arranged in each plane, each respective block comprising a set of memory cells connected to a set of word lines, the set of word lines in each respective block comprise programmed word lines and unprogrammed word lines; and
a control circuit, the control circuit is configured to:
receive a read command identifying a selected word line of each respective block, and in response to the read command, identifying a last-programmed word line for each respective block, and determine whether the last-programmed word line is equal for each respective block;
if the last-programmed word line is equal for each respective block, read the selected word lines of the respective blocks by applying a control gate read voltage to the selected word line and a same baseline read pass voltage to the unprogrammed word lines of each respective block; and
if the last-programmed word line is not equal for each respective block, identify one or more lesser-programmed blocks of the respective blocks and one or more greater-programmed blocks of the respective blocks based on the last-programmed word lines of the respective blocks, and read the selected word lines of the respective blocks by applying a control gate read voltage to the selected word lines while applying a lower read pass voltage, lower than the same baseline read pass voltage, to the unprogrammed word lines of the one or more lesser-programmed blocks.

2. The apparatus of claim 1, wherein:
the lower read pass voltage is relatively low when a number of the lesser-programmed blocks is relatively high.

3. The apparatus of claim 1, wherein:
the lower read pass voltage is relatively low when a number of the unprogrammed word lines of the lesser-programmed blocks is relatively high.

4. The apparatus of claim 1, wherein:
the same baseline read pass voltage is relatively low when a number of the unprogrammed word lines of the respective blocks is relatively high.

5. The apparatus of claim 1, wherein:
the control circuit is configured to perform multiple programming cycles, each programming cycle programs one word line in each respective block in a programming order so that the last-programmed word line of the one or more lesser-programmed blocks is one word line away from the last-programmed word line of the one or more greater-programmed blocks in the programming order.

6. The apparatus of claim 1, wherein:
the selected word lines are programmed word lines other than the last-programmed word lines in the respective blocks.

7. The apparatus of claim 1, further comprising:
a temperature-sensing circuit configured to provide an indication of a temperature, wherein the lower read pass voltage is relatively lower when the temperature is relatively higher.

8. The apparatus of claim 1, wherein:
the read command identifies a same selected word line in each of the respective blocks and a same page type.

9. A method, comprising:
receiving a multi-plane read command, the multi-plane read command identifying a selected word line of a respective block in each plane of a plurality of planes, each respective block comprising a set of memory cells connected to a set of word lines, the set of word lines in each respective block comprise programmed word lines and unprogrammed word lines;
in response to the multi-plane read command, identifying a last-programmed word line for each respective block, and determining whether the last-programmed word line is equal for each respective block;
if the last-programmed word line is equal for each respective block, executing the multi-plane read command by concurrently reading the selected word line of the respective block in each plane; and if the last-programmed word line is not equal for each respective block, performing one or more substitute read operations in place of the multi-plane read command.

10. The method of claim 9, wherein:
the performing the one or more substitute read operations comprises identifying a lesser-programmed block of the respective blocks and a greater-programmed block of the respective blocks based on the last-programmed word lines of the respective blocks, and executing a single-plane read for the greater-programmed block without concurrently reading the lesser-programmed block.

11. The method of claim 10, further comprising:
performing multiple programming cycles, each programming cycle programs one word line in each respective block in a programming order so that the last-programmed word line of the lesser-programmed blocks is one word line away from the last-programmed word line of the greater-programmed block in the programming order.

12. The method of claim 9, wherein:
the multi-plane read command concurrently reads a same selected word line of the respective block in each plane and a same page type among a plurality of page types.

13. The method of claim 9, wherein:
the performing the one or more substitute read operations comprises identifying a lesser-programmed block of the respective blocks and a greater-programmed block of the respective blocks based on the last-programmed word lines of the respective blocks, and executing independent read operations for the greater-programmed block and the lesser-programmed block.

14. The method of claim 13, wherein:
the independent read operations are independent in that the selected word line in reading the greater-programmed block is different than the selected word line in reading the lesser-programmed block.

15. The method of claim 13, wherein:
the independent read operations are independent in that a page type in reading the greater-programmed block is different than a page type in reading the lesser-programmed block.

16. An apparatus, comprising;
a plurality of planes, a plurality of blocks of memory cells arranged in the plurality of planes, each block comprising a set of memory cells connected to a set of word lines; and
a control circuit comprising a look up table, the look up table is configured to store data indicating whether each respective block is fully programmed, the control circuit is configured to, in response to a power up event, access the look up table to identify blocks that are not fully programmed, identify a last-programmed word line for each block which is not fully programmed, and store data identifying the last-programmed word lines;
the control circuit is configured to receive a multi-plane read command and, in response to the multi-plane read command, identify a respective block in each plane and access the data to determine if the last-programmed word line is equal for each respective block; and
the control circuit is configured to execute the multi-plane read operation by concurrently reading a selected word line of each respective block if the last-programmed word line is equal for each respective block, and to perform one or more substitute read operations if the last-programmed word line is not equal for each respective block.

17. The apparatus of claim 16, wherein:
the control circuit is configured to perform a multi-plane pre-fetch operation for respective blocks in respective planes of the plurality of planes for which the data indicates the last-programmed word line is equal for each respective block.

* * * * *